United States Patent [19]

Ishihara et al.

[11] Patent Number: 4,784,874
[45] Date of Patent: * Nov. 15, 1988

[54] PROCESS FOR FORMING DEPOSITED FILM

[75] Inventors: Shunichi Ishihara, Ebina; Shigeru Ohno, Yokohama; Masahiro Kanai; Shunri Oda, both of Tokyo; Isamu Shimizu, Yokohama, all of Japan

[73] Assignee: Canon Kabushiki Kaisha, Tokyo, Japan

[*] Notice: The portion of the term of this patent subsequent to Feb. 23, 2005 has been disclaimed.

[21] Appl. No.: 831,448

[22] Filed: Feb. 20, 1986

[30] Foreign Application Priority Data

| Feb. 20, 1985 | [JP] | Japan | 60-32208 |
| Feb. 21, 1985 | [JP] | Japan | 60-33271 |
| Feb. 22, 1985 | [JP] | Japan | 60-34774 |
| Feb. 25, 1985 | [JP] | Japan | 60-35605 |
| Feb. 26, 1985 | [JP] | Japan | 60-36764 |
| Feb. 27, 1985 | [JP] | Japan | 60-36677 |

[51] Int. Cl.$^4$ ............................................. B05D 3/06
[52] U.S. Cl. ......................................... 427/49; 427/55; 430/128; 430/130; 430/134; 430/136
[58] Field of Search ............... 430/128, 130, 134, 136; 427/86, 49, 55; 423/500, 494

[56] References Cited

U.S. PATENT DOCUMENTS

| 4,084,024 | 4/1978 | Schumacher . | |
| 4,217,374 | 8/1980 | Ovshinsky | 427/39 |
| 4,410,559 | 10/1983 | Hamakawa et al. . | |
| 4,419,381 | 12/1983 | Yamazaki . | |
| 4,439,463 | 3/1984 | Miller . | |
| 4,448,801 | 5/1984 | Fukuda . | |
| 4,450,185 | 5/1984 | Shimizu et al. . | |
| 4,466,992 | 8/1984 | Dreiling . | |
| 4,468,413 | 8/1984 | Bachman . | |
| 4,471,042 | 9/1984 | Komatsu | 430/64 |
| 4,485,125 | 11/1984 | Izu | 427/74 |
| 4,514,437 | 4/1985 | Nath . | |
| 4,517,223 | 5/1985 | Ovshinsky | 427/39 |
| 4,526,805 | 7/1985 | Yoshizawa | 427/38 |
| 4,532,199 | 7/1985 | Ueno . | |
| 4,546,008 | 10/1985 | Saitoh . | |

Primary Examiner—Shrive Beck
Assistant Examiner—Vi Duong Dang
Attorney, Agent, or Firm—Fitzpatrick, Cella, Harper & Scinto

[57] ABSTRACT

A process for forming a deposited film comprises introducing into a film forming space housing a substrate therein an active species (A) formed by decomposition of a compound containing carbon and halogen and an active species (B) formed from a chemical substance for film formation which is chemically mutually reactive with said active species (A) separately from each other, then providing them with heat energy and thereby allowing both the species to react chemically with each other to form a deposited film on the substrate.

23 Claims, 3 Drawing Sheets

PROCESS FOR FORMING DEPOSITED FILM

BACKGROUND OF THE INVENTION

1. Field of the Invention

This invention relates to a process suitable for forming a deposited film, above all a functional film, particularly an amorphous or crystalline deposited film to be used for semiconductor devices, photosensitive devices for electrophotography, line sensors for image input, image pick-up devices, photovoltaic devices etc.

1. Description of the Prior Art

For example, for formation of an amorphous silicon film, an amorphous germanium film, etc. the vacuum deposition method, the plasma CVD method, the CVD method, the reactive sputtering method, the ion plating method, the optical CVD method or the like have been attempted to be practiced, and, in general, the plasma CVD method has widely been used and industrialized.

However, for the deposited film constituted of amorphous silicon, amorphous germanium, etc. there is room left for further improvement of overall characteristics with respect to electrical or optical characteristics and fatigue characteristic in repeated uses, or use environmental characteristic, further productivity and mass productivity including uniformity and reproducibility.

The reaction process in formation of an amorphous silicon deposited film, an amorphous germanium deposited film, etc. according to the plasma CVD method generalized in the prior art is considerably complicated as compared with the CVD method of the prior art, and not a few ambiguities existed in its reaction mechanism. Also, there are involved a large number of parameters for formation of such a deposited film (e.g. substrate temperature, flow rates and ratios of gases introduced, pressure during film formation, high frequency power, electrode structure, structure of reaction vessel, gas discharging speed, plasma generation system, etc.), and the plasma formed by combination of such a large number of parameters may sometimes become unstable to frequently give markedly bad influences to the deposited film formed. Besides, the parameters inherent in the device must be chosen for each device, and it has been difficult under the present situation to generalize the production conditions. On the other hand, for an amorphous silicon film an amorphous germanium film, etc. to exhibit satisfactory electrical, optical, photoconductive or mechanical characteristics, it has been deemed best to form such a film according to the plasma CVD method under the present situation.

However, depending on the applied uses of the deposited film, since it is required to meet sufficiently requirements of enlargement of area, uniformization of film thickness and uniformity of film quality, and also to attempt to perform a mass production with reproducibility by a high speed film formation. enormous equipment capital becomes necessary for mass production devices in formation of amorphous silicon deposited film, amorphous germanium deposited films, etc. according to the plasma CVD mehtod, and the management of these items for mass production thereof will become too complicated and make management complex. These matters, as well as difficulty in the adjustment of the devices, have been pointed out as the problems to be improved in the future. On the other hand, in conventional CVD method of the prior art, high temperature is required to be used however no deposited film having practical characteristics could be obtained.

As described above, in formation of amorphous silicon films, amorphous germanium films, etc. it has earnestly been desired to develop a formation process which can perform mass production by means of a low cost device while maintaining practical characteristics and uniformity. These discussions may also be applicable to other functional films such as silicon nitride films, silicon carbide fllms, silicon oxide films, etc.

SUMMARY OF THE INVENTION

The present invention provides a novel process for formation of a deposited film which removes the drawbacks of the plasma CVD method as described above and also uses no formation method of the prior art.

An object of the present invention is to provide a process for forming a deposited film which is suitable for enlargement of the film and can easily accomplish improvement of productivity and mass production of the film, while attempting to improve the characteristics of the film formed, the film forming speed and reproducibility and also to uniformize film quality.

According to the present invention, there is provided a process for forming a deposited film, which comprises introducing into a film forming space housing a substrate therein an active species (A) formed by decomposition of a compound containing carbon and a halogen and an active species (B) formed from a chemical substance for film formation which is chemically mutually reactive with said active species (A) separately from each other, then providing them with heat energy and thereby allowing both the species to react chemically with each other to form a deposited film on the substrate.

DESCRIPTION OF THE PREFERRED EMBODIMENTS

Figure 1:
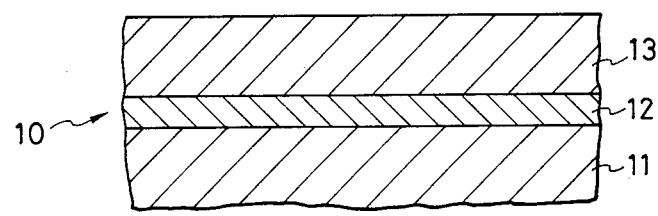
FIG. 1 is a schematic sectional view for illustration of a construction example of the image forming member for electrophotography produced by use of the process of the present invention.

In the process of the present invention, instead of generating plasma in a film forming space for forming a deposited film, heat energy is applied to both active species (A) formed by decomposition of a compound containing carbon and a halogen and active species (B) formed from a chemical substance for film formation coexisting in the film forming space, thereby causing, accelerating or amplifying chemical mutual reactions. Therefore, deposited films thus formed are free from bad influence by etching action or other actions such as abnormal discharging action, etc.

Also, according to the present invention, by controlling the temperature of the atmosphere in the film forming space and the substrate temparature as desired, the CVD process can be made more stable.

In the present invention, heat energy acting on the active species (A) and/or the active species (B) to cause a chemical reaction among them is directed at least to the proximity of a substrate or to the whole film forming space. Heat sources to be used are not specifically limited and there can be employed various heating media heretofore known, for example, heating with heat generating elements such as resistance heating, etc., high frequency heating or the like. Also, heat energy converted from light energy can be used. Further, if desired, light energy can be used in combination with heat energy. Since light energy can be applied by use of an appropriate optical system, to the whole substrate or selectively and controllably to a desired portion of the substrate, the position, thickness, etc. of the deposited film to be formed on the substrate can easily be controlled.

One of the points in which the process of the present invention is different from the CVD process of the prior art is to use active species obtained by being previously activated in a space different from the film forming space (hereinafter referred to as activation space). By doing so, the film forming speed can be dramatically increased as compared with the CVD method of the prior art. In addition, the substrate temperature during film formation can be lowered to a great extent, whereby deposited films with stable film quality can be provided commercially in a large amount and yet at low cost.

The term active species (A) as herein mentioned refers to those having the action of promoting formation of deposited films by causing chemical mutual actions with the active species (B) formed from a chemical substance for film formation, thereby imparting energy or causing chemical reactions to occur. Thus, the active species (A) may either contain the constituent elements which become the constituent elements constituting the deposited film to be formed or contain no such constituent element.

In the present invention, the active species (A) from the activation space (A) should preferably be selected and used as desired from those having a life of 0.1 sec. or longer more preferably 1 sec. or longer, optimally 10 sec. or longer, from the standpoint of productivity and easiness in handling.

In the present invention, as the compound containing carbon and halogen to be introduced into the activation space (A), there may be employed, for example, chain or cyclic hydrocarbons of which hydrogen atoms are partially or wholly substituted with halogen atoms, typically chain carbon halides ropresented by $C_uY_{2u+2}$ (u is an integer of 1 or more Y is at least one element selected from F, Cl, Br and I) cyclic carbon halides represented by $C_vY_{2v}$ (v is an integer of 3 or more, and Y has the same meaning as defined above), and chain or cyclic compounds represented by $C_uH_xY_y$ (u and Y have the same meanings as defined above, $x+y=2u$ or $2u+2$).

Specific examples may include gaseous or readily gasifiable compounds such as $CF_4$, $(CF_2)_4$, $(CF_2)_5$, $(CF_2)_6$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Cl_3F_3$ and the like.

Also, in the present invention, in addition to the active species (A) formed by decomposition of the compound containing carbon and a halogen, it is also possible to use active species (SX) formed by decomposition of a compound containing silicon and a halogen in combination.

As the compound containing silicon and a halogen, there may be employed, for example, chain or cyclic hydrogenated silicon of which hydrogen atoms are partially or wholly substituted with halogen atoms, typically chain silicon halides represented by $Si_uZ_{2u+2}$ (u is an integer of 1 or more, Z is at least one element selected from F, Cl, Br and I), cyclic silicon halides represented by $Si_vZ_{2v}$ (v is an integer of 3 or more, and has the same meaning as defined above), and chain or cyclic compounds represented by $Si_uH_xZ_y$ (u and Z have the same meanings as defined above, $x+y=2u$ or $2u+2$).

Specific examples may include gaseous or readily gasifiable compounds such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiHBr_3$, $SiHI_3$, $Si_2Cl_3F_3$, and the like.

For formation of the active species (A), in addition to the above compound containing carbon and halogen, (and the compound containing silicon and halogen), other silicon compounds such as single substance of silicon, etc., hydrogen, a halogen compound (e.g., $F_2$ gas, $Cl_2$ gas, gasified $Br_2$, $I_2$, etc.) may be used in combination.

Chemical substances for film formation to be used in the present invention are supplied with activation energy in the activation space (B) to be activated, thereby forming the active species (B). The active species (B) is then introduced into the film forming space and react mutually by the action of heat energy with the foregoing active species (A) simultaneously introduced from the activation space (A), thus resulting in easy formation of a desired deposited film on a desired substrate.

As the chemical substance for film formation for forming the active species (B) used in the present invention, there may be included those containing the constituent elements which become the constituent elements constituting the deposited film to be formed and functioning as a starting material for formation of the deposited film or those not containing the constituent elements which become the constituent elements constituting the deposited film to be formed and capable of being considered to merely contribute to film formation. The compounds functioning as a starting material for formation of the deposited film and the compounds contributing to film formation may be used in combination.

The chemical substance for film formation to be used in the present invention may preferably be already gaseous or made gaseous before introduction into activation space (B). For example, when a liquid compound is used, a suitable gasifying device can be connected to the source for supplying the compound, and the compound can be gasified before introduction into the activation space (B).

In the activation space (B) to be used in the process of Ihe present invention, as the above chemical substance for film formation for forming active species (B), hydrogen gas and/or a halogen compound (e.g. $F_2$ gas, $Cl_2$ gas, gasified $Br_2$, $I_2$, etc.) may be advantageously employed. Also, in addition to these chemical substances for film formation, an inert gas such as helium, argon, neon, etc. may be used. When a plurality of these chemical substances for film formation are to be employed, they can be previously mixed before introduction into the activation space (B), or alternatively these chemical substances can individually be supplied from feeding sources independent of each other to be introduced into the activation space (B), or into independent respective activation spaces to be individually activated therein.

In the activation space (B) to be used in the process of the present invention, as the above chemical substance for film formation for forming active species (B), there may also be advantageously employed silicon containing compounds, carbon containing compounds, germanium containing compounds oxygen containing compounds and nitrogen containing compounds.

As the silicon containing compound, there may be employed unsubstituted or substituted silanes having hydrogen, halogen and hydrocarbon groups bonded to silicon. Above all, chain or cyclic silane compounds and those chain and cyclic silane compounds of which hydrogen atoms are substituted partially or wholly with halogen atoms are preferred.

Specifically, there may be included, for example, straight chain silane compounds represented by $Si_pH_{2p+2}$ (p is an integer of 1 or more, preferably 1 to 15, more preferably 1 to 10) such as $SiH_4$, $Si_2H_6$, $Si_3H_8$, $Si_4H_{10}$, $Si_5H_{12}$, $Si_6H_{14}$, etc. which may be substituted with halogen; branched chain silane compounds represented by $Si_pH_{2p+2}$ (p has the same meaning as mentioned above) such as $SiH_3SiH(SiH_3)SiH_3$, $SiH_3SiH(SiH_3)Si_3H_7$, $Si_2H_5SiH(SiH_3)Si_2H_5$, etc. which may be substituted with halogen; and cyclic silane compounds represented by $Si_qH_{2q}$ (q is an integer of 3 or more, preferably 3 to 6) such as $Si_3H_6$, $Si_4H_8$, $Si_5H_{10}$, $Si_6H_{12}$, etc. which may be substituted with other cyclic silanyl groups and/or chain silanyl groups. Exmples of the above silane compounds in which a part or all of the hydrogen atoms are substituted with halogen atoms may include halo-substituted chain or cyclic silane compounds represented by $Si_rH_sX_t$ (X is a halogen atom, r is an integer of 1 or more, preferably 1 to 10, more preferably 3 to 7, s+t=2r+2 or 2r) such as $SiH_3F$, $SiH_3Cl$, $SiH_3Br$, $SiH_3I$, etc. These compounds may be used either alone or as a combination of two or more compounds.

In the above case, in addition to the silicon containing compounds for film formation, it is possible to introduce one or more kinds of the aforesaid hydrogen gas, a halogen compound (e.g. $F_2$ gas, $Cl_2$ gas, gasified $Br_2$, $I_2$, etc.) and an inert gas such as helium, argon, neon, etc. into the activation space (B). when a plurality of these chemical substances for film formation are to be employed, they can be previously mixed before introduction into the activation space (B), or alternatively these starting gases can individually be supplied from feeding sources independent of each other to be introduced into the activation space (B), or into independent respective activation spaces to be individually activated therein.

As the carbon containing compound, there may be employed preferably gaseous or readily gasifiable compounds selected from chain or cyclic saturated or unsaturated hydrocarbon compounds, organic compounds containing carbon and hydrogen as main constituent atoms and additionally containing at least one of halogen, sulfur, etc. as constituent atoms, and organic silicon compounds containing hydrocarbon groups as constituent components or having silicon-carbon bonds.

Among them, as hydrocarbon compounds, there may be enumerated saturated hydrocarbons aaving 1 to 5 carbon atoms, ethylenic hydrocarbons having 2 to 5 carbon atoms, acetylenic hydrocarbons having 2 to 4 carbon atoms, including specifically, as saturated hydrocarbons, methane ($CH_4$), ethane ($C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2($C_4H_8$), isobutylene ($C_4H_8$), pentene ($C_5H_{10}$); as acetylenic hydrocarbons, acetylene ($C_2H_2$), methylacetylene ($C_3H_4$), butyne ($C_4H_6$), etc.

As halo-substituted hydrocarbon compounds, there may be enumerated compounds in which at least one of hydrogen atoms which are constituents of the above hydrocarbon compounds are substituted with F, Cl, Br or I, particularly those in which hydrogen is substituted with F or Cl, as effective ones.

The halogens substituted for hydrogen may be either one kind or two or more kinds in one compound.

As organic silicon compounds to be used in the present invention may include organosilanes and organohalogenosilanes.

Organosilanes and organohalogenosilanes are compounds represented, respectively, by the general formulae:

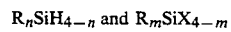

wherein R is alkyl or aryl; X is F, Cl, Br or I; n=1,2,3 or 4; and m=1,2 or 3, including typically alkylsilanes, arylsilanes, alkylhalogenosilanes, and arylhalogenosilanes.

Specific example of organochlorosilanes include
trichloromethylsilane $CH_3SiCl_3$,
dichlorodimethylsilane $(CH_3)_2SiCl_2$,
chlorotrimethylsilane $(CH_3)_3SiCl$,
trichloroethylsilane $C_2H_5SiCl_3$ and
dichlorodiethylsilane $(C_2H_5)_2SiCl_2$.

Specific examples of organochlorofluorosilanes include
chlorodifluoromethylsilane $CH_3SiF_2Cl$,
dichlorofuloromethylsilane $CH_3SiFCl_2$,
chlorofulorodimethylsilane $(CH_3)_2SiFCl$,
chloroethyldifluorosilane $(C_5H_5)SiF_2Cl$,
dichloroethylfluorosilane $C_2H_5SiFCl_2$,
chlorodifluoropropylsilane $C_3H_7SiF_2Cl$ and
dichlorofluoropropylsilane $C_3H_7SiFCl_2$.

Specific examples of organosilanes include
tetramethylsilane $(CH_3)_4Si$,
ethyltrimethylsilane $(CH_3)_3SiC_2H_5$,
trimethylpropylsilane $(CH_3)_3SiC_3H_7$,
triethylmethylsilane $CH_3Si(C_2H_5)_3$ and
tetraethylsilane $(C_2H_5)_4Si$.

Specific examples of organohydrogenosilanes include
methylsilane $CH_3SiH_3$,
dimethylsilane $(CH_3)_2SiH_2$,
trimethylsilane $(CH_3)_3SiH$,
diethylsilane $(C_2H_5)_2SiH_2$,
triethylsilane $(C_2H_5)_3SiH$,
tripropylsilane $(C_3H_7)_3SiH$ and
diphenylsilane $(C_6H_5)_2SiH_2$.

Specific examples of organofluorosilane include
trifluoromethylsilane $CH_3SiF_3$,
difluorodimethylsilane $(CH_3)_2SiF_2$,
fluorotrimethylsilane $(CH_3)_3SiF$,
ethyltrifluorosilane $C_2H_5SiF_3$,
diethyldifluorosilane $(C_2H_5)_2SiF_2$,
triethylfulorosilane $(C_2H_5)_3SiF$ and
trifluoropropylsilane $(C_3H_7)SiF_3$.

Specific examples of organobromosilanes include
bromotrimethylsilane $(CH_3)_3SiBr$ and
dibromodimethylsilane $(CH_3)_2SiBr_2$.

In addition, it is also possible to use organopolysilanes, for example,
organodisilanes such as
hexamethyldisilane $[(CH_3)_3Si]_2$ and ·
hexapropyldisilane $[(C_3H_7)_3Si]_2$.

These carbon containing compounds may be used either alone or as a combination of two or more compounds.

In the above case, in addition to the carbon containing compounds, one or more kinds of hydrogen halogen compounds (e.g. $F_2$ gas, $Cl_2$ gas, gasified $Br_2$, $I_2$, etc.) inert gases such as helium, neon, argon, etc. and the aforesaid silicon compounds may be introduced into the activation space (B). When a plurality of these chemical substances for film formation are to be employed, they can be previously mixed in a gaseous state before introduction into the activation space (B), or alternatively these starting gases for film formation can individually be supplied from feeding sources independent of each other to be introduced into the activation space (B), or into independent respective activation spaces to be individually activated therein.

As the germanium containing compounds, there may be employed inorganic or organic germanium containing compounds having hydrogen, halogens or hydrocarbon groups bonded to germanium, as exemplified by organic germanium compounds such as chain or cyclic hydrogenated germanium represented by $Ge_aH_b$ (a is an integer of 1 or more, b=2a+2 or 2a); polymers of the hydrogenated germanium; compounds in which a part or all of the hydrogen atoms in the above hydrogenated germanium are substituted with halogen atoms; compounds in which a part or all of the hydrogen atoms in the above hydrogenated germanium compounds are substituted with organic groups such as alkyl groups, aryl groups, etc. or, if desired, halogen atoms; etc. and inorganic germanium compounds such as sulfide, imides, etc.

Specifically, there may be enumerated, for example, $GeH_4$, $Ge_2H_6$, $Ge_3H_8$, n-$Ge_4H_{10}$, tert-$Ge_4H_{10}$, $Ge_3H_6$, $Ge_5H_{10}$, $GeH_3F$, $GeH_3Cl$, $GeH_2F_2$, $H_6GeF_6$, $Ge(CH_3)_4$, $Ge(C_2H_5)_4$, $CH_3GeH_3$, $(CH_3)_2GeH_2$, $(CH_3)_3GeH$, $(C_2H_5)_2GeH_2$, $Ge(CH_3)_2F_2$, $GeF_2$, $GeF_4$, GeS, $Ge_3N_4$, Ge $(NH_2)_2$, etc.

These germanium compounds may be used either alone or as a combination of two or more compounds.

In the above case, in addition to the germanium containing compounds, one or more kinds of hydrogen, a halogen compound (e.g. $F_2$ gas, $Cl_2$ gas, gasified $Br_2$, $I_2$, etc.), an inert gas such as helium, neon, argon, etc. compounds aforesaid silicon containing compounds or carbon containing may be introduced into the activation space (B). When a plurality of these chemical substances for film formation are to be employed, they can be previously mixed in a gaseous state before introduction into the activation space (B), or alternatively these starting gases for film formation can individually be supplied from feeding sources independent of each other to be introduced into the activation space (B), or into independent respective activation spaces to be individually activated therein.

As the oxygen containing compound, there may be mentioned compounds containing oxygen atoms and at least one atom other than oxygen as constituent atoms. Other atoms than oxygen as mentioned above include hydrogen (H), halogens (X=F, Cl, Br or I), sulfur (S), carbon (C), silicon (Si), germanium (Ge), phosphorus (P), boron (B), alkali metals, alkaline earth metals, transition metals, etc. In addition, still other atoms, of elements belonging to the respective groups in the periodic table, which can be bonded to an oxygen atom may be available.

For example, as compounds containing O and H, there may be enumerated $H_2O$, $H_2O_2$, etc.; as compounds containing O and S, oxides such as $SO_2$, $SO_3$, etc.; as compounds containing O and C, oxides such as CO, $CO_2$, etc.; as compounds containing O and Si, siloxanes such as disiloxane ($H_3SiOSiH_3$), trisiloxane ($H_3SiOSiH_2OSiH_3$), etc., organoacetoxylilanes such as diacetoxydimethylsilane $(CH_3)_2Si(OCOCH_3)_2$, triacetoxymethylsilane $CH_3Si(OCOCH_3)_3$, etc., alkylalkoxysilanes such as methoxytrimethylsilane $(CH_3)_3SiOCH_3$, dimethoxydimethylsilane $(CH_3)_2Si(OCH_3)_2$, trimethoxymethylsilane $CH_3Si(OCH_3)_3$, etc.; organosilanols such as trimethylsilanol $(CH_3)_3SiOH$, dimethylphenyl silanol $(CH_3)_2(C_6H_5)SiOH$, diethylsilanediol $(C_2H_5)_2Si(OH)_2$, etc.; as compounds containing O and Ge, oxides, hydroxides of Ge, germanic acids, organic germanium compounds such as $H_3GeOGeH_3$, $H_3GeOGeH_2OGeH_3$, etc., but the oxygen containing compounds to be used in the present invention are not limited to these compounds.

These oxygen containing compounds may be used either alone or as a combination of two or more compounds.

Also, it is possible to use gases other than these compounds such as $O_2$, $O_3$, etc.

In the above case, in addition to the oxygen containing compounds, it is possible to introduce at least one of hydrogen, halogen compounds (e.g. $F_2$ gas, $Cl_2$ gas, gasified $Br_2$, $I_2$, etc.), inert gases such as helium, neon, argon, etc. and the aforesaid silicon containing compounds, carbon containing compounds or germanium containing compounds into the activation space (B). When a plurality of these chemical substances for film formation are to be employed, they can be previously mixed in a gaseous state before introduction into the activation space (B), or alternatively these chemical substances for film formation can individually be supplied from feeding sources independent of each other to be introduced into the activation space (B), or into independent respective activation spaces to be individually activated therein.

As the nitrogen containing compound, there may be included compounds containing nitrogen atoms and at least one atom other than nitrogen as constituent atoms. Other atoms than nitrogen as mentioned above include hydrogen (H), halogens (X=F, Cl, Br or I), sulfur (S), carbon (C), oxygen (O), phosphorus (P), silicon (Si), germanium (Ge), boron (B), alkali metals, alkaline earth metals, transition metals, etc. In addition, still other atoms, of elements belonging to the respective groups in the periodic table, which can be bonded to a nitrogen atom may be available.

For example, as compounds containing N and H, there may be enumerated $NH_3$, $NH_4H_3$, $N_2H_5N_3$, $H_2NNH_2$, primary to tertiary amines, halides of these amines, hydroxylamine, etc.; as compounds containing N and X, $N_3X$, $N_2X_2$, $NX_3$, NOX, $NO_2X$, $NO_3X_4$, etc.; as compounds containing N and S, $N_4S_4$, $N_2S_5$, etc.; as compounds containing N and C, $N(CH_3)_3$, HCN and cyanides, HOCN and salts thereof, etc.; as compounds containing N and O, $N_2O$, NO, $NO_2$, $N_2O_3$, $N_2O_4$, $N_2O_5$, $NO_3$, etc; as compounds containing N and P, $P_3N_5$, $P_2N_3$, PN, etc. In addition, there may also be employed organosilazanes such as triethylsilazane $(C_2H_5)_3SiNH_2$, hexamethyldisilazane $[(CH_3)_3Si]_2NH$, hexaethyldisilazane $[(C_2H_5)_3Si]_2NH$, etc.; organosilicon isocyanates such as trimethylsilicon isocyanate $(CH_3)_3SiNCO$, dimethylsilicon diisocyanate $(CH_3)_2Si(NCO)_2$, etc.; organosilicon isothiocyanates such as trimethylsilicon isothiocyanate $(CH_3)_3SiNCS$, etc. The nitrogen containing compound is not limited to these compounds provided that the compound is fit for attaining the object of the present invention.

These nitrogen containing compounds may be used either alone or as a combination of two or more compounds. Also, it is possible to use $N_2$ gas.

In the above case, in addition to the nitrogen containing compounds, it is possible to introduce at least one of hydrogen, halogen compounds (e.g. $F_2$ gas, $Cl_2$ gas, gasified $Br_2$, $I_2$, etc.), inert gases such as helium, neon, argon, etc. and the aforesaid silicon containing compounds, carbon containing compounds, germanium containing compounds or oxygen containing compounds into the activation space (B). When a plurality of these chemical substances for film formation are to be employed, they can be previously mixed in a gaseous state before introduction into the activation space (B), or alternatively these chemical substances for film formation can individually be supplied from feeding sources independent of each other to be introduced into the activation space (B), or into independent respective activation spaces to be individually activated therein.

In the present invention, the proportion in amount of the active species (A) to the active spacies (B) in the film forming space may suitably be determined depending on the depositing conditions, the kind of activated species, etc., but may preferably be 10:1 to 1:10, more preferably 8:2 to 4:6.

In the present invention, as the method for forming activated species (A) and (B) in the activation spaces (A) and (B), respectively, there may be employed various activation energies such as electrical energies including microwave, RF, low frequency, DC, etc., heat energies including heater heating, IR-ray heating, etc., optical energies and the like in view of the respective conditions and the device.

On the other hand, the deposited film formed according to the present invention can be doped with impurity elements during or after film formation. As the impurity elements to be used, there may be employed, as p-type impurities, elements belonging to group III A of the periodic tale such as B, Al, Ga, In, Tl, etc. and, as n-type imputities, elements belonging to group VA of the periodic table such as N, P, As, Sb, Bi, etc. as suitable ones. Particularly, B, Ga, P and Sb are most preferred. The doping amount of impurities may be determined suitably depending on the desired electrical and optical characteristics.

Among compounds containing such impurity atoms as the components, it is preferable to select a compound which is gaseous under normal temperature and normal pressure, or gaseous at least under the activating conditions, or a compound which can be readily gasified by a suitable gasifying device. Such compounds include $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc. The compounds containing impurity atoms may be used either alone or as a combination of two or more compounds.

The substances for introduction of impurities may be introduced into the activation space (A) and/or the activation space (B) together with the respective substances for formation of the active species (A) and the active species (B) to be activated therein alternatively activated in a third activation space (C) separate from the activation space (A) and the activation space (B).

The substance for introduction of impurity can be employed by selecting suitably the activation energy as described above. The active species formed by activation of the substance for introduction of impurity (PN) may be previously mixed with the active species (A) and/or the active species (B) before introduction into the film forming space or independently introduced into the film forming space.

Next, the present invention is described by referring to a typical example of the image forming member for electrophotography formed by the process of the present invention.

FIG. 1 is a schematic sectional view for illustration of the construction example of a typical photoconductive member obtained by the present invention.

Photoconductive member 10 shown in FIG. 1 is applicable as an image forming member for electrophotography, and has a layer constitution consisting of intermediate layer 12 which may optionally be provided and photosensitive layer 13 provided on substrate 11 for photoconductive member.

In preparation of the photoconductive member 10, intermediate layer 12 and/or the photosensitive member 13 can be prepared according to the process of the present invention. Further, when the photoconductive member 10 has an protective layer provided for the purpose of protecting chemically or physically the surface of the photosensitive layer 13, or a lower barrier layer and/or an upper barrier layer provided for improving dielectric strength, these layers can also be prepared according to the process of the present invention.

The substrate 11 may be either electroconductive or insulating. As electroconductive substrates, there may be mentioned metals such as NiCr, stainless steel, Al, Cr, Mo, Au, Ir, Nb, Ta, V, Ti, Pt, Pd, etc. or alloys thereof.

As insulating substrates, these may conventionally be used, films or sheets of synthetic resins, including polyesters, polyethylene, polycarbonates, cellulose acetate, polypropylene, polyvinyl chloride, polyvinylidene chloride, polystyrene, polyamides, etc., glasses, ceramics, papers and so on. At least one side surface of these substrates is preferably subjected to treatment for imparting electroconductivity, and it is desirable to form other layers on the side at which said electroconductive treatment has been applied.

For example, electroconductive treatment of a glass can be effected by providing a thin film of NiCr, Al, Cr, Mo, Au, Ir, Nb, Ta, v, Ti, Pt, Pd, $In_2O_3$, $SnO_2$, ITO($In_2O_3+SnO_2$), etc. thereon. Alternatively, a synthetic resin film such as a polyester film can be subjected to the electroconducitve treatment on its surface by, for example, vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with the said metal, thereby imparting electroconductivity to the surface. The substrate may be shaped in any form such as cylinders, belts, plates or others, and its form may be determined as desired. For example, when the photoconductive member 10 in FIG. 1 is to be used as a light-receiving member for electrophotography, it may desirably be formed into an endless belt or a cylinder for use in continuous high speed copying.

For example, the intermediate layer 12 has the function of impeding effectively inflow of the carriers from the side of the substrate 11 into the photosensitve layer 13 and permitting easy passage of the photocarriers, formed in the photosensitive layer 13 by irradiation of electromagnetic waves and migrating toward the side of the substrate 11, from the side of the photosensitive layer 13 to the side of the substrate 11.

The intermediate layer 12 may be consititued of, for example, amorphous carbon containing carbon atoms, hydrogen atoms(H) and/or halogen atoms(X), as constituent atoms (hereinafter written as "A-C(H, X)"); amorphous silicon containing hydrogen atoms (H) and/or halogen atoms (X) (hereinafter written as A-Si(H,X)); an amorphous material containing silicon atoms and carbon atoms, optionally together with hydrogen atoms (H) and/or halogen atoms (X), as constitutent atoms (hereinafter written as "A-SiC(H,X)"); amorphous germanium containing optionally silicon atoms (Si), hydrogen atoms (H), halogen atoms (X) and carbon atoms (C) as constituent atoms (hereinafter written as "A-Ge(Si, H, X, C)"); an amorphous material containing silicon atoms, oxygen atoms and carbon atoms, optionally together with hydrogen atoms (H) and/or halogen atoms (X), as constituent atoms (hereinafter written as "A-SiOC(H, X)"); an amorphous material containing silicon atoms, nitrogen atoms and carbon atoms, optionally together with oxygen atoms, hydrogen atoms (H) and/or halogen atoms (X) as constituent atoms (hereinafter written as "A-SiNC(O, H, X)"), etc. and at the same time can sometimes contain, for example, a p-type impurity such as B or an n-type impurity such as P as a substance for controlling electroconductivity, if necessary.

In the present invention, the content of substances controlling conductivity such as B, P, etc. contained in the intermediate layer 12 may preferably be 0.001 to $5 \times 10^4$ atomic ppm, more preferably 0.5 to $1 \times 10^4$ atomic ppm, optimally 1 to $5 \times 10^3$ atomic ppm.

In the case of forming the intermediate layer 12, as starting materials for formation of the intermediate layer, active species (A) formed in activation space (A) and active species (B) formed in activation space (B), optionally together with active species formed by activation of hydrogen, halogens, inert gases, gases of silicon containing compounds, germanium containing compounds, carbon containing compounds, compounds containing impurity elements as components, etc. may be introduced respectively and separately into the film forming space, in which the substrate 11 is placed, and the intermediate layer 12 may be formed on the substrate 11 by applying heat energy to the coexistence atmosphere of the respective species introduced to cause chemical reaction.

The compound containing carbon and halogen capable of forming active species (A) by introduction into the activation space (A) during formation of the intermediate layer 12 should desirably be one seleted from the compounds as mentioned above which can form readily active species such as, for example, $CF_2^*$. Similarly, as the compound containing silicon and halogen, it is desirable to select a compound from the compounds as mentioned above which can form readily active species such as, for example $SiF_2^*$.

The intermediate layer 12 should have a layer thickness preferably 30 Å to 10μ more preferably 40 Å to 8 μ, optimally 50 Å to 5 μ.

The photosensitive layer 13 is constituted of, for example, an amorphous material having a matrix of silicon atoms and optionally containing hydrogen atoms and/or halogen atoms (X) as constituent atoms (hereinafter referred to as "A-Si(H,X)"); an amorphous material having a matrix of silicon atoms and carbon atoms and optionally containing hydrogen atoms (H) and/or halogen atoms (X) (hereinafter referred to as "A-SiC(H,X); an amorphous material having a matrix of silicon atoms and optionally containing hydrogen, halogen germanium, carbon, etc. as constituent atoms (hereinafter referred to as A-Si(H, X, Ge, C); and amorphous material having a matrix of silicon atoms and germanium atoms optionally containing hydrogen, halogen, carbon, etc. (A-SiGe(H,X,C)) and the like, and has both functions of the charge generation function of generating photocarriers by irradiation of laser beam and the function of transporting the charges.

The photosensitive layer 13 should have a layer thickness preferably of 1 to 100 μ, more preferably 1 to 80 μ, optimally 2 to 50 μ.

The photosensitive layer 13 is constituted of non-doped A-Si(H,X), A-SiC(H,X), A-Si(H,X,Ge,C), A-SiGe(H,X,C), etc. but it may also contain a substance for controlling conductivity characteristics with a polarity different from the polarity of the substance for controlling conductivity characteristics contained in the intermediate layer 12 (e.g. n-type), if desired, or a substance of the same polarity may be contained therein, when the practical amount contained in the intermediate layer 12 is much, in an amount by far smaller than said amount.

Formation of the photosensitive layer 13 may be practiced, similarly as in the case of the intermediate layer 12, if it is to be prepared according to the process of the present invention, by introducing a compound containing carbon and halogen and separately a compound containing silicon and halogen into the activation space (A), decomposing these under a high temperature or exciting these through the action of discharging energy or light energy to form active species (A) and introducing said active species (A) into deposition space.

In the case of forming a intermediate layer 12 which is similar to or the same in constituents as the photosensitive layer 13, up to formation of the photoconductive layer 13 can continuously be performed subsequent to formation of the intermediate layer 12.

Further, if desired, it is also possible to form an amorphous deposited film containing carbon and silicon as constituent atoms as the surface layer on the photosensitive layer and, in this case, film formation can also be conducted according to the process of the present invention, similarly as the above intermediate layer and photosensitive layer.

Figure 2:
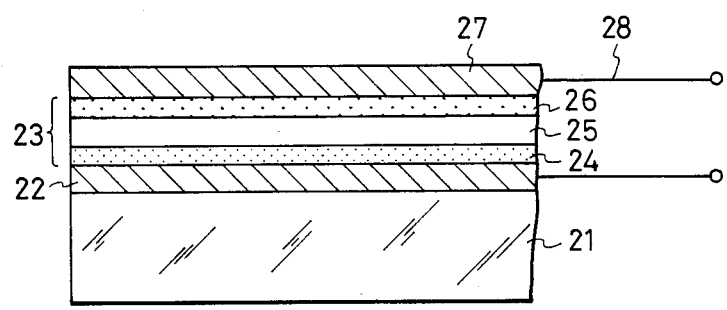
FIG. 2 is a schematic sectional view for illustration of a construction example of a PIN type diode produced by use of the proccess of the present invention.

FIG. 2 is a schematic illustration showing a typical example of a PIN type diode device utilizing a deposited film doped with an impurity element prepared by carrying out the process of the present invention.

In the drawing, 21 is a substrate, 22 and 27 are thin film electrodes, 23 is a semiconductor film consisting of an n-type semiconductor layer 24, an i-type semiconductor layer 25 and a p-type A-Si semiconductor layer 26. While the present invention may be applicable for preparation of any one layer of the semiconductor layers 24, 25 and 26, particularly the semiconductor layer 26 can be prepared according to the process of the present invention to enhance conversion efficiency. When the semiconductor layer 26 is prepared by the process of the present invention, the semiconductor layer 26 can be constructed of, for example, an amorphous material containing silicon atoms, carbon atoms, hydrogen atoms and/or halogen atoms as constituent atoms (hereinafter referred to as "A-SiC(H,X)"); an amorphous material containing silicon atoms, carbon atoms, germanium atoms, hydrogen atoms and/or halogen atoms as constituent atoms (hereinafter referred to as "A-SiGeC(H,X)"); an amorphous material containing silicon atoms, carbon atoms, oxygen atoms, hydrogen atoms and/or halogen atoms as constituent atoms (hereinafter referred to as "A-SiCO(H,X)"); an amorphous material containing silicon atoms, nitrogen atoms, carbon atoms, hydrogen atoms and/or halogen atoms (hereinafter referred to "A-SiNC(H,X)"),etc. 28 is a conductive wire to be connected to the external electrical circuit.

As the substrate 21, there may be employed a conductive, semiconductive or insulating substrate.

When the substrate 21 is conductive, the thin film electrode 22 may be omitted. As the semiconductive substrate, there may be employed, for example, semiconductors such as Si, Ge, GaAs, ZnO, ZnS, etc. Thin film electrodes 22, 27 can be obtained by forming thin films of NiCr, Al, Cr, Mo, Au, Ir, Nb, Ta, V, Ti, Pt, Pd, $In_2O_3$, $SnO_2$, ITO($IN_2O_3+SnO_2$), etc. on the substrate 21 by treatment such as vacuum deposition, electron beam vapor deposition, sputtering, etc. The electrodes 22, 27 have a film thickness preferably of 30 to $5\times10^4$ Å, more preferably 100 to $5\times10^3$ Å.

For rendering the film constituting the semiconductor layer n-type or p-type, if desired, it can be formed by doping an n-type impurity or a p-type impurity or both impurities into the layer to be formed, while controlling its amount, during layer formation.

For formation of n-type. i-type and p-type semiconductor layers, any one or all of the layers can be formed by the process of the present invention, with the film formation being performed by introducing a compound containing carbon and halogen and, if desired, separately introducing a compound containing silicon and halogen, into the activation space (A), then exciting and decomposing these by the action of an activation energy, whereby active species (A) of, for example, $CF_2^*$, $SiF_2^*$, etc. can be formed and introduced into the film forming space. Also, separately, chemical substances for film formation introduced into the activation space (B), optionally together with an inert gas and a gas containing an impurity element as the component, may be respectively excited and decomposed by respective activation energies to form respective active species, which are then separately or in an appropriate mixture introduced into the film forming space in which substrate 11 is placed to form a deposited film by use of heat energy. The n-type and p-type semiconductor layers should have a layer thickness preferably of 100 to $10^4$ Å, more preferably 300 to 2000 Å. On the other hand, the i-type semiconductor layer should preferably have a layer thickness preferably of 500 to $10^4$ Å, more preferably 1000 to 10,000 Å.

The PIN type diode device shown in FIG. 2 is not necessarily required to prepare all the layers of P, I and N according to the process of the present invention, and the present invention can be carried out by preparing at least one layer of P, I and N according to the process of the present invention.

According to the process for forming a deposited film of the present invention, electrical, optical, photoconductive and mechanical characteristics desired for the film to be formed can be improved, and yet a high speed film formation is possible without maintaining the substrate at a high temperature. Also, reproducibility in film formation can be improved to enable improvement of the film quality and uniformization of the film quality, and the process is also advantageous in enlargment of area of the film and can easily accomplish improvement of productivity of films as well as bulk production of films. Further, since relatively low heat energy can be used as an excitation energy during film formation, there can be exhibited such effects that film formation can be effected also on a substrate which is poor in heat resistance or susceptible to plasma etching action, and that the steps can be shortened by low temperature treatment. The present invention is described by referring to the following Examples.

EXAMPLE 1

Figure 3:
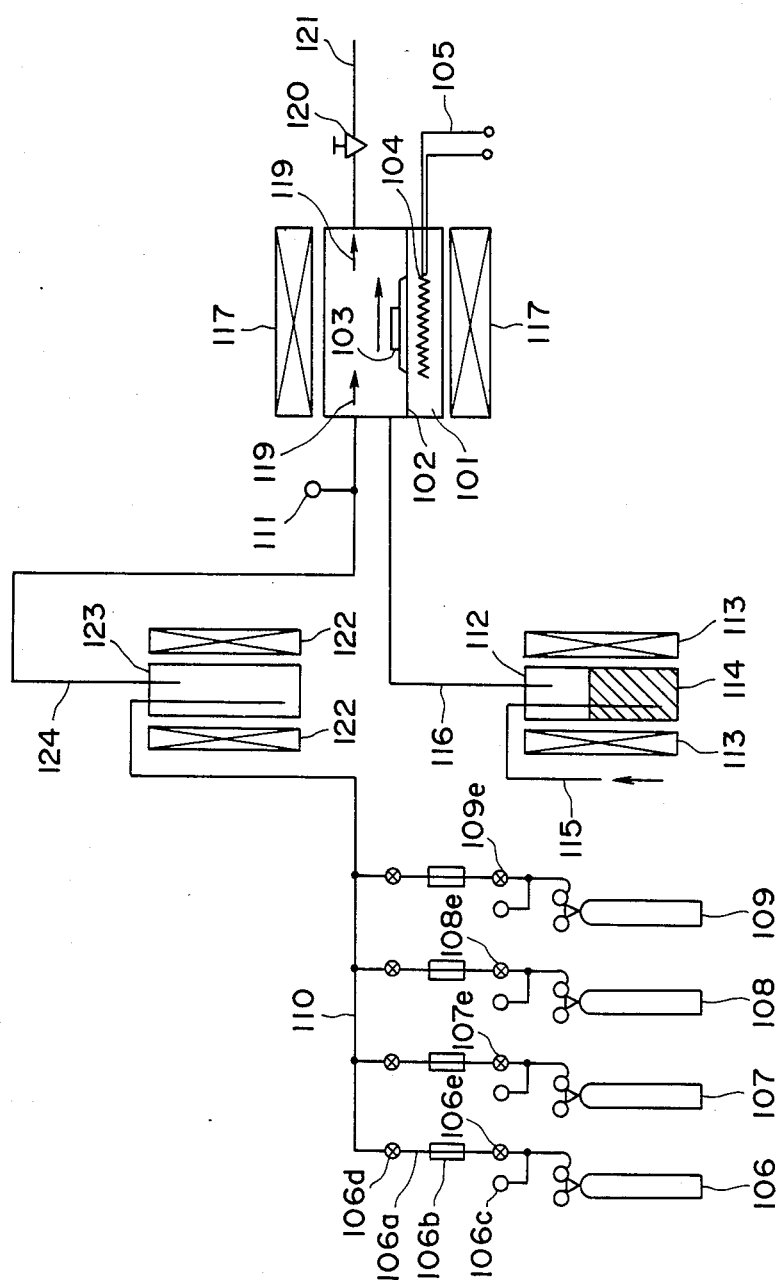
FIGS. 3 and FIG. 4 are schematic diagrams for illustration of the constructions of the devices for practicing the process of the present invention employed in respective examples.

By means of the device as shown in FIG. 3, i-type, p-type and n-type carbon-containing amorphous deposited films were formed according to the operations as described below.

In FIG. 3, 101 is a film forming chamber, and a desired substrate 103 is placed on a substrate supporting stand 102 provided internally therein.

104 is a heater for heating the substrate, which heater 104 is used for heating treatment of the substrate 104 before the film forming treatment or, after film formation, for annealing treatment for further improvement of the characteristics of the film formed, and electricity is supplied through a conductive wire 105 to generate heat.

The substrate temperature in practicing the process of the present invention is not particularly limited, but it should preferably be 30° to 450° C., more preferably 50° to 350° C.

106 through 109 are gas feeding systems, and they are provided corresponding to the kinds of the gases for film formation, and inert gases optionally employed, and the gases of the compounds containing impurity element as the component. When these gases employed are liquid under the standard condition, a suitable gasifying device is provided.

In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B), and the active species (B) formed is introduced through the inflow pipe 124 into the film forming chamber 101. 111 is a gas pressure gauge.

In the drawing, 112 shows an activation chamber (A), 113 an electric furnace, 114 solid carbon particles and 115 a pipe for introduction of a gaseous compound containing carbon and halogen as the starting material for active species (A). The active species (A) formed in the activation chamber 112 is introduced through the inflow pipe 116 into the film forming chamber 101.

117 is a heat energy generating device and, for example, conventional electric furnaces, high frequency heating devices, various heating elements etc. may be employed.

The heat from the heat energy generating device 117 is imparted to the active species flowing in the direction of the arrowhead 119, and said heated active species undergo mutual chemical reaction thereby to form a deposited film of A-Si(H,X) on the whole or the desired portion of the substrate 103. In the drawing, 120 shows a gas discharging valve and 121 a gas discharging pipe.

First, a polyethyleneterephthalate film 103 was placed on a supporting stand 102, and the film forming chamber 101 was evacuated by use of an evacuating device (not shown) to about $10^{-6}$ Torr. From a gas feeding source 106, $H_2$ gas at 150 SCCM was introduced into the activation chamber (B) 123 through the gas inflow pipe 110. $H_2$ gas introduced into the activation chamber (B) 123 was activated by means of the microwave plasma generating device 122 to be converted to activated hydrogen, etc., which was then introduced into the film forming chamber 101.

On the other hand, the activation chamber (A) 112 was packed with solid carbon particles 114, heated by the electric furnace 113 to be maintained at about 1100° C., thereby bringing C into a red hot state, whereinto $CF_4$ was blown through the inflow pipe 115 from the bomb (not shown), thus forming active species of $CF_2$*, which were then introduced into the film forming chamber 101 via the inflow pipe 116.

Thus, while maintaining the inner pressure in the film forming chamber 101 at 0.4 Torr, the film forming chamber was maintained internally at 205° C. by the heat energy generating device to form a carbon-containing amorphous film (film thickness 700 Å). The film forming speed was 28 Å/sec.

Subsequently, the carbon-containing amorphous film sample was placed in a vacuum deposition tank, wherein a comb-type Al-gap electrode (length 250 μ, width 5 mm) was formed under vacuum of $10^{-5}$ Torr, and the dark electroconductivity $\sigma_d$ was determined by measuring dark current at an applied voltage of 10 V for evaluation of the film characteristics of the respective samples. The results are shown in Table 1A.

EXAMPLE 2

Except for introducing $F_2$ gas in addition to $H_2$ gas from the gas feeding bomb 106 (gas ratio $H_2/F_2=15$), a carbon-containing amorphous A-C(H,X) film was formed following the same procedure as in Example 1. The dark electroconductivities were measured for respective samples to obtain the results shown in Table 1A.

From Table 1A, it can be seen that carbon-containing amorphous films excellent in electrical characteristics namely having higher $\sigma$ values, as compared with the prior art, can be obtained according to the present invention.

EXAMPLE 3

Figure 4:
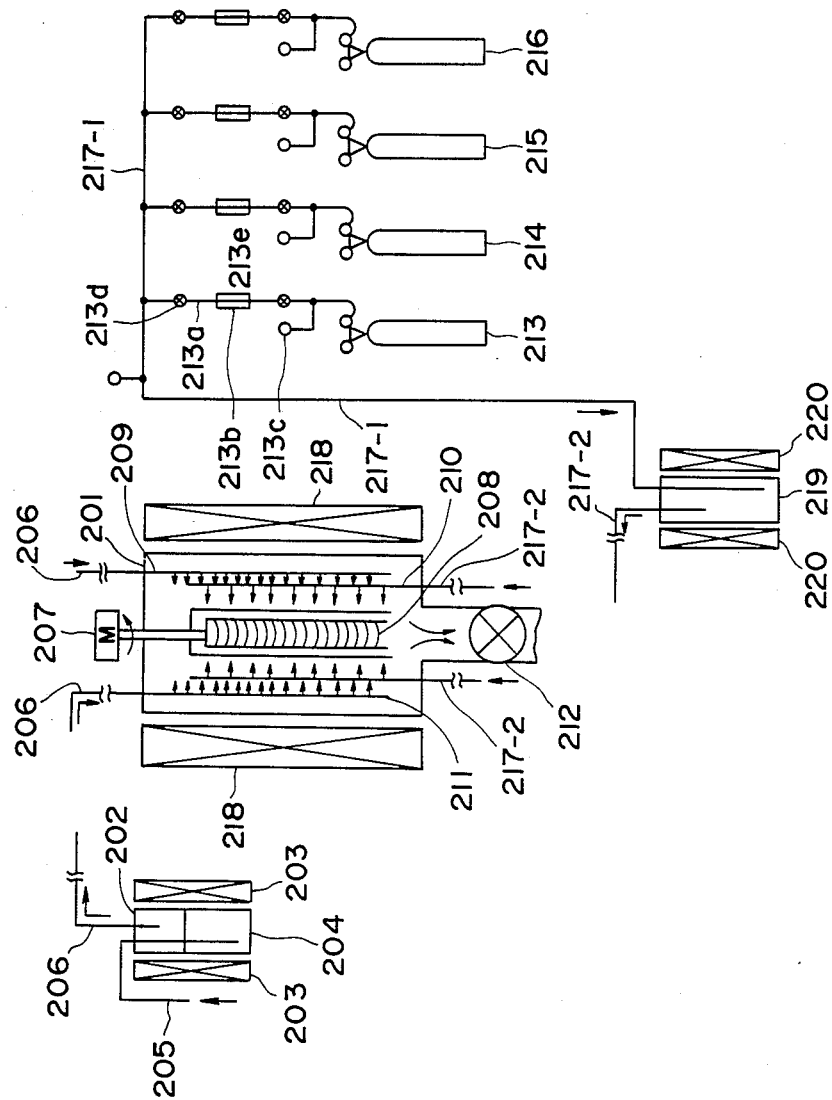

By means of the device as shown in FIG. 4, a drum-shaped image forming member for electrophotography with a layer construction as shown in FIG. 1 was prepared according to the operations as described below.

In FIG. 4, 201 shows a film forming chamber, 202 an activation chamber (A), 203 an electric furnace, 204 solid carbon particles, 205 an inflow pipe for the starting material of active species (A), 206 a pipe for introducing active species, 207 a motor, 208 a heater which is used similarly as 104 in FIG. 3, 209 and 210 are blowing pipes, 211 an aluminum cylinder substrate and 212 a gas discharging valve. 213 through 216 are starting gas feeding sources similarly as 106 through 109 in FIG. 3, and 217-1 is a gas introducing pipe.

In the film forming chamber 201, the aluminum cylinder 211 is suspended, equipped internally thereof with the heater 208 so as to be rotatable with the motor 207. 218 is a heat energy generating device, and conventional electric furnaces, high frequency heating devices and various heat generating elements may be employed.

Also, the activation chamber (A) 202 is packed with solid carbon particles 204, heated by the electric furnace 203 to be maintained at about 1000° C. to bring carbon into a red hot state, whereinto $CF_4$ is blown from bomb (not shown) to form active species of $CF_2$*, which are then introduced into the film forming chamber 201 via the inflow pipe 206.

Also, from the activation chamber (C) (not shown) having a structure similar to the activation chamber (A) 202, active species (C) of $SiF_2$* from solid Si particles and $SiF_4$ were introduced.

On the other hand, through the inflow pipe 217-1, $H_2$ gas was introduced into the activation chamber (B) 219. The $H_2$ gas introduced was subjected to activation treatment such as plasma formation by means of the microwave plasma generating device 220 in the activation chamber (B) 219 to become activated hydrogen, which was then introduced through the inflow pipe 217-2 into the film forming chamber 201. During this operation, if desired, impurity gases such as $PH_3$, $B_2H_6$, etc. were also activated by introduction into the activation chamber (B) 219. While maintaining the pressure in the film forming chamber 201 at 0.8 Torr, the film forming chamber was maintained internally at 205° C.

The aluminum cylinder 211 was rotated, while the discharging gas was discharged by controlling adequately the opening of the discharging valve 212. Thus, a photosensitive layer 13 was formed.

Also, the intermediate layer 12 was formed to a film thickness of 2000 Å by introducing a gas mixture of $H_2/B_2H_6$ (0.2% of $B_2H_6$ in terms of vol. %) through the inflow pipe 217-1.

COMPARATIVE EXAMPLE 1

According to the plasma CVD method of the prior art, an image forming member for electrophotography having a layer construction as shown in FIG. 1 was formed by use of respective gases of $CF_4$, $SiF_4$, $H_2$ and $B_2H_6$ by means of the device having the same film forming chamber as the film forming chamber 201 provided with a high frequency means of 13.56 MHz.

The conditions for preparation of the drum-shaped image forming members for electrophotography obtained in Example 3 and Comparative example 1 and their performances are shown in Table 2A.

EXAMPLE 4

By means of the device as shown in FIG. 3, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, active species $SiF_2$*, active species $CF_2$* formed similarly as in Example 3, $H_2$ gas, $PH_3$ gas (diluted to 1000 ppm with hydrogen gas) were respectively introduced into the activation chamber (B) 123 to be activated.

Subsequently, the activated gases were introduced through the inflow pipe 116 into the film forming chamber 101. While maintaining the pressure in the film forming chamber 101 at 0.1 Torr, the film forming temperature was maintained internally at 205° C. to form a n-type A-SiC(H,X) film 24 (film thickness: 700 Å) doped with P.

Next, according to the same method as in formation of the n-type A-SiC(H,X) film except for stopping introduction of PH₃ gas and increasing the value of SiF₂*/CF₂* to three-fold, a non-doped type A-SiC(H,X) film 25 (film thickness: 5000 Å) was formed.

Subsequently, by use of B₂H₆ gas (diluted to 1000 ppm with hydrogen gas) together with H₂ gas, following otherwise the same conditions as in the case of n-type, a p-type A-SiC(H,X) film 26 (film thickness: 700 Å) doped with B was formed. On this p-type film was formed by vapor deposition an aluminum electrode 27 with a thickness of 1000 Å to provide a PIN type diode.

The diode element thus obtained (area 1 cm²) was subjected to measurement of I - V characteristic, and rectifying characteristic and photovoltaic effect were evaluated. The results are shown in Table 3A.

Also, in photoirradiation characteristics, light was introduced from the substrate side, and a conversion efficiency of 8.0% or higher, an open circuit voltage of 0.88 V and a short circuit current of 10.2 mA/cm² were obtained at a photoirradiation intensity AMI (about 100 mW/cm²).

EXAMPLE 5

Except for introducing a gas F₂ in addition to the H₂ gas from the inflow pipe 110 (gas ratio H₂/F₂=15), the same PIN type diode as in Example 4 was prepared. The rectifying characteristic and photovoltaic effect were evaluated for this sample and the results are shown in Table 3A.

From Table 3A, it can be seen that an amorphous semiconductor PIN type diode having better optical and electrical characteristics as compared with the prior art can be obtained according to the present invention.

EXAMPLE 6

By means of the device as shown in FIG. 3, i-type, p-type and n-type A-SiC(H,X) deposited films were formed according to the operations as described below.

In FIG. 3, 101 is a film forming chamber, and a desired substrate 103 is placed on a substrate supporting stand 102 provided internally therein.

104 is a heater for heating the substrate, and electricity is supplied through a conductive wire 105 to generate heat. The substrate temperature is not particularly limited, but preferably 50° to 450° C., more preferably 100° to 350° C., in practicing the process of the present invention.

106 through 109 are gas feeding systems, and they are provided corresponding to the kinds of the compounds containing carbon and halogen, and hydrogen, halogen compounds optionally employed, gases of the compounds containing impurities as the component. When these gases employed are liquid under the standard condition, a suitable gasifying device is provided. In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases.

123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B), and the active species (B) formed is introduced through the inflow pipe 124 into the film forming chamber 101.

111 is a gas pressure gauge. In the drawing, 112 shows an activation chamber (A), 113 an electric furnace, 114 solid C particles and 115 a pipe for introduction of a gaseous compound containing carbon and halogen as the starting material for active species (A). The active species (A) formed in the activation chamber 112 is introduced thorugh the inflow pipe 116 into the film forming chamber 101.

117 is a heat energy generating device and, for example, conventional electric furnaces, high frequency heating devices and various heating elements may be employed.

The heat from the heat energy generating device is permitted to act on the active species flowing in the direction of the arrowhead 119, and the heated active species undergo mutually chemical reaction thereby to form a deposited film of A-Si(H,X) on the whole or the desired portion of the substrate 103. In the drawing, 120 shows a gas discharging valve and 121 a gas discharging pipe.

First, a polyethyleneterephthalate film 103 was placed on a supporting stand 102, and the film forming chamber 101 was evacuated by use of an evacuating device (not shown) to about 10⁻⁶ Torr. At the substrate temperature indicated in Table 1B, from a gas feeding source 106, Si₅H₁₀ at 150 SCCM or a gas mixture thereof with PH₃ gas or B₂H₆ gas (each being diluted to 1000 ppm with hydrogen gas) at 40 SCCM was introduced into the activation chamber (B) 123 thorugh the gas inflow pipe 110.

Si₅H₁₀ gas, etc. introduced into the activation chamber (B) 123 was activated by means of the microwave plasma generating device 122 to be converted to activated silicon, activated hydrogen etc., which were then introduced through the inflow pipe 124 into the film forming chamber 101.

On the other hand, the activation chamber (A) 112 was packed with solid carbon particles 114, heated by the electric furnace 113 to be maintained at about 1100° C., thereby bringing C into red hot state, whereinto CF₄ was blown through the inflow pipe 115 from the bomb (not shown), thus forming active species of CF₂*, which were then introduced into the film forming chamber 101 via the inflow pipe 116.

Thus, while maintaining the inner pressure in the film forming chamber 101 at 0.4 Torr, the film forming chamber was maintained internally at 220° C. by means of the heat energy generating device to form non-doped or doped A-SiC film (film thickness: 700 Å). The film forming speed was 35 Å/sec.

Subsequently, the non-doped or p-type or n-type carbon-containing amorphous film sample was placed in a vacuum deposition tank, wherein a comb-type Al-gap electrode (length 250 μ, width 5 mm) was formed under vacuum of 10⁻⁵ Torr, and the dark electroconductivity $\sigma_d$ was determined by measuring dark current at an application voltage of 10 V for evaluation of the film characteristics of the respective samples. The results are shown in Table 1B.

EXAMPLES 7-9

Except for using straight chain $Si_4H_{10}$, branched $Si_4H_{10}$ or $H_6Si_6F_6$ in place of $Si_5H_{10}$, the A-Si films similar to Example 6 were formed. The dark electroconductivities were measured to obtain the results shown in Table 1B.

From Table 1B, it can be seen that carbon-containing amorphous silicon films excellent in electrical characteristics, namely having high values, can be obtained according to the present invention and also that A-SiC(H,X) films sufficiently doped can be obtained.

EXAMPLE 10

By means of the device as shown in FIG. 4, a drum-shaped image forming member for electrophotography with a layer construction as shown in FIG. 1 was prepared according to the operations as described below.

In FIG. 4, 201 shows a film forming chamber, 202 an activation chamber (A), 203 an electric furnace, 204 solid carbon particles, 205 an inflow pipe for the starting material of active species (A), 206 a pipe for introducing active species, 207 a motor, 208 a heater which is used similarly as 104 in FIG. 3, 209 and 210 are blowing pipes, 211 an aluminum cylinder substrate and 212 a gas discharging valve. 213 through 216 are starting gas feeding sources similarly as 106 through 109 in FIG. 3, and 217-1 is a gas introducing pipe.

In the film forming chamber 201, the aluminum cylinder 211 is suspended, equipped internally thereof with the heater 208 so as to be rotatable with the motor 207. 218 is a heat energy generating device, and conventional electric furnaces, high frequency devices, various heating elements may be employed.

The activation chamber (A) 202 is packed with solid carbon particles 204, heated by the electric furnace 203 to be maintained at about 1000° C. to bring carbon into red hot state, whereinto $CF_4$ is blown from bomb (not shown) to form active species of $CF_2^*$, which are then introduced into the film forming chamber 201 via the inflow pipe 206.

On the other hand, through the inflow pipe 217-1, $CH_4$ and $H_2$ gases are introduced into the activation chamber (B) 219. The $H_2$ gas introduced is subjected to activation treatment such as plasma formation by means of the microave plasma generating device 220 in the activation chamber (B) 219 to become activated hydrogen, which was then introduced through the inflow pipe 217-2 into the film forming chamber 201. During this operation, if desired, impurity gases such as $PH_3$, $B_2H_6$, etc. are also activated by introduction into the activation chamber (B) 219.

While maintaining the pressure in the film forming chamber 201 at 1.0 Torr, the film forming chamber 20 is maintained internally at 200° C. by means of the heat energy generating device.

The aluminum cylinder 211 is heated to 210° C. by the heater, maintained thereat and rotated, while the discharging gas is discharged through the discharging valve 212. Thus, a photosensitive layer 13 is formed.

The intermediate layer 12 is formed to a film thickness of 2000 Å by introducing a gas mixture of $H_2/B_2H_6$ (0.2% of $B_2H_6$ in terms of vol. %) through the inflow pipe 217-1.

COMPARATIVE EXAMPLE 2

According to the plasma CVD method of the prior art, an image forming member for electrophotography having a layer construction as shown in FIG. 1 was formed by use of respective gases of $CF_4$, $Si_2H_6$, $H_2$ and $B_2H_6$ by means of the device having the same film forming chamber as the film forming chamber 201 provided with a high frequency means of 13.56 MHz.

The conditions for preparation of the drum-shaped image forming members for electrophotography obtained in Example 10 and Comparative example 2 and their performances are shown in Table 2B.

EXAMPLE 11

By means of the device as shown in FIG. 3, with the use of $Si_3H_6$ as the silicon-containing compound, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, active species $CF_2^*$ formed similarly as in Example 6 was introduced into the activation chamber (B) 123 to be activated. Also, from the inflow pope 110, $Si_3H_6$ at 150 SCCM and $PH_3$ gases (diluted to 1000 ppm with hydrogen gas) were respectively introduced into the activation chamber (B) 123 to be activated. Next, the activated gases were introduced through the inflow pipe 116 into the film forming chamber 101. While maintaining the pressure in the film forming chamber at 0.1 Torr and the temperature at 210° C., a n-type A-SiC(H,X) film 24 (film thickness: 700 Å) doped with P was formed.

Subsequently, by introducing $B_2H_6$ gas (diluted to 300 ppm with hydrogen gas) in place of $PH_3$ gas, following otherwise the same conditions as in the case of n-type A-SiC(H,X) film 24, an i-type A-SiC(H,X) film 25 (film thickness: 5000 Å) was formed.

Next, by use of $B_2H_6$ gas (diluted to 1000 ppm with hydrogen gas) together with $H_2$ gas in place of $PH_3$ gas, following otherwise the same conditions as in the case of n-type A-SiC(H,X) film 24, a p-type A-SiC(H,X) film 26 (film thickness: 700 Å) doped with B was formed. On this p-type film was further formed by vapor deposition an aluminum electrode 27 with a thickness of 1000 Å to provide a PIN type diode.

The diode element thus obtained (area 1 cm$^2$) was subjected to measurement of I - V characteristic, and rectifying characteristic and photovoltaic effect were evaluated. The results are shown in Table 3B.

In photoirradiation characteristics, light was introduced form the substrate side, and a conversion efficiency of 8.6% or higher, an open circuit voltage of 0.93 V and a short circuit current of 9.9 mA/cm$^2$ were obtained at a photoirradiation intensity AMI (about 100 mW/cm$^2$).

EXAMPLES 12-14

Except for using straight chain $Si_4H_{10}$, branched $Si_4H_{10}$ or $H_6Si_6F_6$ in place of $Si_3H_6$, the same PIN type diode as in Exmaple 6 was prepared. The rectifying characteristic and photovoltaic effect were evaluated and the results are shown in Table 3B.

From Table 3B, it can be seen that an A-SiC(H,X) PIN type diode having better optical and electrical characteristics as compared with the prior art can be obtained according to the present invention.

EXAMPLE 15

By means of the device as shown in FIG. 3, an amorphous carbon-containing deposited film was formed according to the operations as described below.

In FIG. 3, 101 is a film forming chamber, and a desired substrate 103 is placed on a substrate supporting stand 102 provided internally therein.

104 is a heater for heating the substrate, and electricity is supplied through a conductive wire 105 to generate heat. The heated substrate temperature is not particularly limited, but it should preferably be 30° to 450° C., more preferably 50° to 350° C., in practicing the process of the present invention.

106 through 109 are gas feeding systems, and they are provided corresponding to carbon compounds, and the kinds of gases optionally employed such as hydrogen, halogen compounds, inert gases and compounds containing impurity elements as the component. When these gases employed are liquid under the standard condition, a suitable gasifying device is provided.

In the drawing, symbols of the gas feeding sources 106 thorugh 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B) 123, and the actice species (B) formed is introduced through the inflow pipe 124 into the film forming chamber 101. 111 is a gas pressure gauge.

In the drawing, 112 shows an activation chamber (A), 113 an electric furnace, 114 solid C particles and 115 a pipe for introduction of a gaseous compound containing carbon and halogen as the starting material for active species (A). The active species (A) formed in the activation chamber (A) 112 is introduced through the inflow pipe 116 into the film forming chamber 101.

117 is a heat energy generating device and, for example, conventional electric furnaces, high frequency heating devices, various heat generating bodies, etc. may be employed.

The heat from the heat generating device 117 is permitted to act on the active species flowing in the direction of the arrowhead 119, and the heated active species undergo mutually chemical reaction thereby to form a carbon-containing deposited film on the whole or the desired portion of the substrate 103. In the drawing, 120 shows a gas discharging valve and 121 a gas discharging pipe.

First, a substrate of polyethyleneterephthalate film 103 was placed on a supporting stand 102, and the film forming chamber 101 was evacuated by use of an evacuating device (not shown) to about $10^{-6}$ Torr. At the substrate temperature shown in Table 1C, using a gas feeding source 106, $CF_4$ gas at 150 SCCM was introduced into the activation chamber (B) 123 through the gas inflow pipe 110. $CH_4$ gas, etc. introduced into the activation chamber (B) 123 was activated by means of the microwave plasma generating device 122 to be converted to activated species of hydrogenated carbon, activated hydrogen etc., which were then introduced through the inflow pipe 124 into the film forming chamber 101.

On the other hand, the activation camber (A) 122 was packed with solid C particles 114, heated by the electric furnace 113 to be maintained at about 1000° C., thereby bringing C into a red hot state, whereinto $CF_4$ was blown through the inflow pipe 115 from the bomb (not shown), thus forming active species of $CF_2^*$, which were then introduced into the film forming chamber 101 via the inflow pipe 116.

Thus, while maintaining the inner pressure in the film forming chamber 101 at 0.3 Torr, a carbon-containing amorphous deposited film (film thickness: 700 Å) was formed. The film forming speed was 28 Å/sec.

Subsequently, the sample having A-C(H,X) film formed thereon was placed in a vacuum deposition tank, wherein a comb-type Al-gap electrode (gap length 250 $\mu$, width 5 mm) was formed under vacuum of $10^{-5}$ Torr, and the dark electroconductivity $\sigma_d$ was determined by measuring dark current at an application voltage of 10 V for evaluation of the film characteristics of the respective samples. The results are shown in Table 1C.

EXAMPLES 16–18

Except for using straight chain $C_2H_6$, $C_2H_4$ or $C_2H_2$ in place of $CH_4$, carbon-containing amorphous A-C(H,X) films were formed in the same manner as in Example 15. The dark electroconductivities were measured to obtain the results shown in Table 1C.

From Table 1C, it can be seen that amorphous carbon-containing films excellent in electrical characteristics can be obtained according to the present invention.

EXAMPLE 19

By means of the device as shown in FIG. 2, a drum-shaped image forming member for electrophotography with a layer construction as shown in FIG. 1 was prepared according to the operations as described below.

In FIG. 4, 201 shows a film forming chamber, 202 an activation chamber (A), 203 an electric furnace, 204 solid C particles, 205 an inflow pipe for the starting material of active species (A), 206 a pipe for introducing active species, 207 a motor, 208 a heater which is used similarly as 104 in FIG. 3, 209 and 210 are blowing pipes, 211 an aluminum cylinder substrate and 212 a gas discharging valve. 213 through 216 are starting gas feeding sources similarly as 106 through 109 in FIG. 1, and 217 is a gas introducing pipe.

In the film forming chamber 201, the aluminum cylinder 211 is suspended, equipped internally thereof with the heater 208 so as to be rotatable with the motor 207.

218 is a heat energy generating device and, for example, conventional electric furnaces, high frequency heating devices, various kinds of heat generating elements may be employed.

Also, the activation chamber (A) 202 is packed with solid C particles 204, heated by the electric furnace 203 to be maintained at about 1100° C. to bring C into a red hot state, whreinto $CF_4$ is blown to form active species of $CF_2^*$, which are then introduced into the film forming chamber 201 via the inflow pipe 206.

On the other hand, through the inflow pipe 217-1, $CH_4$, $Si_2H_6$ and $H_2$ gases are introduced into the activation chamber (B) 219. The $CH_4$, $Si_2H_6$ and $H_2$ gas introduced are subjected to activation treatment such as plasma formation by means of the microwave plasma generating device 220 in the activation chamber (B) 219 to become hydrocarbon active species, hydrogenated silicon active species and activated hydrogen, which are then introduced through the inflow pipe 217-2 into the film forming chamber 201. During this operation, if desired, impurity gases such as $PH_3$, $B_2H_6$, etc. are also activated by introduction into the activation chamber (B) 219. Then, while maintaining the pressure in the film forming chamber 201 at 1.0 Torr, the film forming chamber 201 was maintained internally at 200° C. by means of the heat energy generating device.

The aluminum cylinder substrate 211 is heated to 220° C. by the heater 208, maintained thereat and rotated, while the discharging gas is discharged by controlling adequately the opening of the discharging valve 212. Thus, a photosensitive layer 13 is formed.

Also, the intermediate layer 12 is formed to a film thickness of 2000 Å by introducing a gas mixture of $H_2/B_2H_6$ (0.2% of $B_2H_6$ in terms of vol. %) through the inflow pipe 217-1.

COMPARATIVE EXAMPLE 3

According to the plasma CVD method of the prior art, an image forming member for electrophotography having a layer construction as shown in FIG. 1 was formed by use of respective gases of $CF_4$, $CH_4$, $Si_2H_6$, $H_2$ and $B_2H_6$ by means of the device having the same film forming chamber as the film forming chamber 201 provided with a high frequency means of 13.56 MHz.

The conditions for preparation of the drum-shaped image forming members for electrophotography obtained in Example 19 and Comparative example 3 and their performances are shown in Table 2C.

EXAMPLE 20

By means of the device as shown in FIG. 3, with the use of $CH_4$ as the carbon compound, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, active species $CF_2^*$ and active species $SiF_2^*$ were introduced into the film forming chamber 101 through the inflow pipe 116 similarly as in Example 15. Also, $Si_2H_6$ and $PH_3$ gases (diluted to 1000 ppm with hydrogen gas) were respectively introduced into the activation chamber (B) 123 to be activated. Then, the activated gases were introduced through the inflow pipe 124 into the film forming chamber 101. While maintaining the pressure in the film forming chamber at 0.1 Torr and the substrate temperature at 210° C., an n-type A-SiC(H,X) film 24 (film thickness: 700 Å) doped with P was formed.

Next, according to the same method as in formation of the n-type A-SiC(H,X) film except for stopping introduction of $PH_3$ gas and increasing the value of $SiF_2^*/CF_2^*$ to three-fold, a non-doped type A-SiC(H,X) film 25 (film thickness: 5000 Å) was formed.

Subsequently, by introducing $CH_4$ and $B_2H_6$ gas (diluted to 1000 ppm with hydrogen gas) together with $Si_2H_6$ gas, following otherwise the same conditions as in the case of n-type, an A-SiC(H,X) film 26 (film thickness: 700 Å) doped with B was formed. Further, on this p-type film was formed by vapor deposition an aluminum electrode 27 with a thickness of 1000 Å to provide a PIN type diode.

The diode device thus obtained (area 1 cm$^2$) was subjected to measurement of I - V characteristic, and rectifying characteristic and photovoltaic effect were evaluated. The results are shown in Table 3C.

Also, in photoirradiation characteristics, light was introduced from the substrate side, and a conversion efficiency of 7.6% or higher, an open circuit voltage of 0.95V and a short circuit current of 10.2 mA/cm$^2$ were obtained at a photoirradiation intensity AMI (about 100 mW/cm$^2$).

EXAMPLES 21-23

Except for using $C_2H_6$, $C_2H_4$ or $C_2H_2$ in place of $CH_4$ as the carbon compound, the same PIN type diode as in Example 20 was prepared in the same manner as in Exmaple 20. The rectifying characteristic and photovoltaic effect were evaluated and the results are shown in Table 3C.

From Table 3C, it can be seen that an amorphous semiconductor PIN type diode having better optical and electrical characteristics as compared with the prior art can be obtained according to the present invention.

EXAMPLE 24

By means of the device as shown in FIG. 3, i-type, p-type and n-type A-GeC(H,X) deposited films were formed according to the operations as described below.

In FIG. 3, 101 is a film forming chamber, and a desired substrate 103 is placed on a substrate supporting stand 102 provided internally therein.

104 is a heater for heating the substrate, and electricity is supplied through a conductive wire 105 to generate heat. The substrate temperature is not particularly limited, but preferably 30° to 450° C., more preferably 50° to 350° C., in practicing the process of the present invention.

106 through 109 are gas feeding systems, and they are provided corresponding to germanium-containing compounds, and the kinds of gases optionally employed such as hydrogen, halogen compounds, inert gases, silicon-containing compounds, carbon-containing compounds and compounds containing impurity elements as the component. When these gases employed are liquid under the standard condition, a suitable gasifying device is provided. In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is the activation chamber (B) for forming active species (B) and, around the activation chamber 123, there is provided the heat energy generating device 122 for generating activation energy for formation of active species (B) such as an electric furnace, IR-ray heating means, etc. The starting gas for formation of active species (B) supplied from the gas inflow pipe 110 is activated in the activation chamber (B), and the active species (B) formed is introduced through the inflow pipe 124 into the film forming chamber 101. 111 is a gas pressure gauge.

In the drawing, 112 shows an activation chamber (A), 113 an electric furnace, 114 solid C particles and 115 a pipe for introduction of a gaseous compound containing carbon and halogen as the starting material for active species (A). The active species (A) formed in the activation chamber (A) 112 is introduced through the inflow pipe 116 into the film forming chamber 101.

117 is a heat energy generating device and, for example, conventional electric furnaces, high frequency heating devices and various kinds of heat generating elements etc. may be employed.

The heat from the heat generating device 117 is permitted to act on the active species flowing in the direction of the arrowhead 119, and the heated active species undergo mutually chemical reaction thereby to form a deposited film of A-GeC(H,X) on the whole or the desired portion of the substrate 103. In the drawing, 120 shows a gas discharging valve and 121 a gas discharging pipe.

First, a substrate of polyethyleneterephthalate film 103 was placed on a supporting stand 102, and the film forming chamber 101 was evacuated by use of an evacuating device to about $10^{-6}$ Torr. From a gas feeding source 106, GeH$_4$ gas at 150 SCCM, or a gas mixture thereof with PH$_3$ gas or B$_2$H$_6$ gas (each diluted to 1000 ppm with hydrogen gas) was introduced into the activation chamber (B) 123 through the gas inflow pipe 110. GeH$_4$ gas, etc. introduced into the activation chamber (B) 123 was activated by means of the microwave plasma generating device 122 to be converted to activated hydrogenated germanium species, activated hydrogen etc., which were then introduced through the inflow pipe 124 into the film forming chamber 101.

On the other hand, the activation chamber (A) 112 was packed with solid C particles 114, heated by the electric furnace 113 to be maintained at about 1100° C., thereby bringing C into a red hot state, whereinto CF$_4$ was blown through the inflow pipe 115 from the bomb not shown, thus forming active species of CF$_2$*, which were then introduced into the film forming chamber 101 via the inflow pipe 116.

While maintaining the inner pressure in the film forming chamber 101 at 0.4 Torr, the film forming chamber was maintained internally at 220° C. by means of the heat energy generating device to form non-doped or doped A-GeC(H,X) film (film thickness: 700 Å), respectively. the film forming speed was 32 Å/sec.

Subsequently, the non-doped or p-type A-GeC(H,X) film sample obtained was placed in a vacuum deposition tank, wherein a comb-type Al-gap electrode (gap length 250μ, width 5 mm) was formed under vacuum of $10^{-5}$ Torr, and the dark electroconductivity $\sigma_d$ was determined by measuring dark current at an applied voltage of 10V for evaluation of the film characteristics of the respective samples. The results are shown in Table 1D.

EXAMPLES 15-27

Except for using straight Ge$_4$H$_{10}$, branched Ge$_4$H$_{10}$, or H$_6$Ge$_6$F$_6$ in place of GeH$_4$, A-GeC(H,X) films were formed in the same manner as in Example 24. The dark electroconductivities were measured to obtain the results shown in Table 1D.

From Table 1D, it can be seen that A-GeC(H,X) films excellent in electrical characteristics can be obtained and, also A-GeC(H,X) films subjected to satisfactory doping can be obtained according to the present invention.

EXAMPLE 28

By means of the device as shown in FIG. 4, a drum-shaped image forming member for electrophotography with a layer construction as shown in FIG. 1 was prepared according to the operations as described below.

In FIG. 4, 201 shows a film forming chamber, 202 an activation chamber (A), 203 an electric furnace, 204 solid Si particles, 205 an inflow pipe for the starting material of active species (A), 206, a pipe for introducing active species (A), 207 a motor, 208 a heater which is used similarly as 104 in FIG. 3, 209 and 210 are blowing pipes, 211 an aluminum cylinder substrate and 212 a gas discharging valve. 213 through 216 are starting gas feeding sources similarly as 106 through 109 in FIG. 3, and 217 is a gas introducing pipe.

In the film forming chamber 201, the aluminum cylinder substrate 211 is suspended, equipped internally thereof with the heater 208 so as to be rotatable with the motor 207. 218 is a heat energy generating device, and conventional electric furnaces, high frequency heating devices, various heat generating elements, etc. may be employed.

Also, the activation chamber (A) 202 is packed with solid C particles 204, heated by the electric furnace 203 to be maintained at about 1000° C. to bring C into red hot state, whereinto CF$_4$ is blown through the inflow pipe 205 to form active species of CF$_2$*, which are then introduced into the film forming chamber 201 via the inflow pipe 206.

On the other hand, through the inflow pipe 217-1, Si$_2$H$_6$, GeH$_4$ and H$_2$ gases are introduced into the activation chamber (B) 219. The Si$_2$H$_6$, GeH$_4$ and H$_2$ gases introduced are subjected to activation treatment such as plasma formation by means of the microwave plasma generating device 220 in the activation chamber (B) 219 to become hydrogenated silicon active species, hydrogenated germanium active species and activated hydrogen, which are then introduced through the inflow pipe 217-2 into the film forming chamber 201. During this operation, if desired, impurity gases such as PH$_3$, B$_2$H$_6$, etc. are also activated by introduction into the activation chamber (B) 219.

The aluminum cylinder 211 is heated by the heater to 220° C., maintained thereat, and rotated, while the discharging gas is discharged by controlling the opening of the discharging valve 212. Thus, a photosensitive layer 13 is formed.

Also, the intermediate layer 12 is formed to a film thickness of 2000 Å by introducing a gas mixture of Si$_2$H$_6$, GeH$_4$, H$_2$ and B$_2$H$_6$ (0.2% of B$_2$H$_6$ in terms of vol. %) through the inflow pipe 217-1.

COMPARATIVE EXAMPLE 4

According to the plasma CVD method of the prior art, an image forming member for electrophotography having a layer construction as shown in FIG. 1 was formed by use of respective gases of CF$_4$ and Si$_2$H$_6$, GeH$_4$, H$_2$ and B$_2$H$_6$ by means of the device having the same film forming chamber as the film forming chamber 201 provided with a high frequency means of 13.56 MHz.

The conditions for preparation of the drum-shaped image forming members for electrophotography obtained in Example 28 and Comparative example 4 and their performances are shown in Table 2D.

EXAMPLE 29

By means of the device as shown in FIG. 3, with the use of GeH$_4$ as the germanium-containing compound, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, active species CF$_2$*, active species SiF$_2$* were introduced into the film forming chamber 101 similarly as in Example 24.

Also, Si$_2$H$_6$ gas, GeH$_4$ gas and PH$_3$ gas (diluted to 1000 ppm with hydrogen gas) were respectively introduced into the activation chamber (B) 123 to be activated.

The activated gases were introduced through the inflow pipe 124 into the film forming chamber 101 and, while maintaining the pressure in the film forming chamber at 0.4 Torr, and the substrate temperature at 220° C., an n-type A-SiGeC(H,X) film 24 (film thickness 700 Å) doped with P was formed.

Next, according to the same method as in formation of the n-type A-SiGeC(H,X) film except for introducing $B_2H_6$ gas (diluted to 300 ppm with hydrogen gas) in place of $PH_3$ gas and changing the value of $SiF_2^*/CF_2^*$ to three-fold, a non-doped A-SiGeC(H,X) film 25 (film thickness: 5000 Å) was formed.

Subsequently, by using $B_2H_6$ gas (diluted to 1000 ppm with hydrogen gas), following otherwise the same conditions as in the case of n-type, a p-type A-SiGeC(H,X) film 26 (film thickness: 700 Å) doped with B was formed. Further, on this p-type film was formed by vapor deposition an aluminum electrode 27 with a thickness of 1000 Å to provide a PIN type diode.

The diode element thus obtained (area 1 $cm^2$) was subjected to measurement of I - V characteristic, and rectifying characteristic and photovoltaic effect were evaluated. The results are shown in Table 3D.

Also, in photoirradiation characteristics, light was introduced from the substrate side, and a conversion efficiency of 7.0% or higher, an open circuit voltage of 0.88V and a short circuit current of 11 $mA/cm^2$ were obtained at a photoirradiation intensity AMI (about 100 $mW/cm^2$).

EXAMPLE 30-32

Except for using straight $Ge_4H_{10}$, branched $Ge_4H_{10}$ or $H_6Ge_6F_6$ in place of $GeH_4$ as the germanium-containing compound, the same PIN type diode as in Example 29 was prepared in the same manner as in Example 29. The rectifying characteristic and photovoltaic effect were evaluated and the result are shown in Table 3D.

From Table 3D, it can be seen that an A-SiGeC(H,X) PIN type diode having better optical and electrical characteristics as compared with the prior art can be obtained according to the present invention.

EXAMPLE 33

By means of the device as shown in FIG. 3, amorphous deposited films were formed according to the operations as described below.

In FIG. 3, 101 is a film forming chamber, and a desired substrate 103 is placed on a substrate supporting stand 102 provided internally therein.

104 is a heater for heating the substrate, which heater 104 is used for heating treatment of the substrate 103 before the film forming treatment or, after film formation, for annealing treatment for further improvement of the characteristics of the film formed, and electricity is supplied through a conductive wire 105 to generate heat. The substrate temperature is not particularly limited, but preferably 30° to 450° C., more preferably 50° to 350° C., in practicing the process of the present invention.

106 through 109 are gas feeding systems, and they are provided corresponding to the gases for film formation, and the kinds of gases optionally employed such as inert gases, and gases of compounds containing impurity elements as the component. When these gases employed are liquid under the standard condition, a suitable gasifying device is provided.

In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is the activation chamber (B) for forming active species (B) and, around the activation chamber 123, there is provided the microwave plasma generating device 122 for generating activation energy for formation of active species (B). The starting gas for formation of active species (B) supplied from the gas inflow pipe 110 is activated in the activation chamber (B), and the active species (B) formed is introduced through the inflow pipe 124 into the film forming chamber 101. 111 is a gas pressure gauge.

In the drawing, 112 shows an activation chamber (A), 113 an electric furnace, 114 solid carbon particles and 115 a pipe for introduction of a gaseous compound containing carbon and halogen as the starting material for active species (A). the active species (A) formed in the activation chamber 112 is introduced through the inflow pipe 116 into the film forming chamber 101.

117 is a heat energy generating device and, for example, conventional electric furnaces, high frequency heating devices, various heat generating elements, etc. may be employed.

The heat from the heat energy generating device 117 is allowed to act on the active species flowing in the direction of the arrowhead 119, and the heated active species undergo mutually chemical reaction thereby to form a deposited film of A-Si on the whole or the desired portion of the substrate 103. In the drawing, 120 shows a gas discharging valve and 121 a gas discharging pipe.

First, a polyethyleneterephthalate film 103 was placed on a supporting stand 102, and the film forming chamber 101 was evacuated by use of an evacuating device to about $10^{-6}$ Torr. Disiloxane made gaseous from the bomb for gas feeding 106 was introduced into the activation chamber (B) 123 through the gas inflow pipe 110. Disiloxane introduced into the activation chamber (B) 123 was activated by means of the microwave plasma generating device 122 to be converted to activated disiloxane, which was then introduced through the inflow pipe 124 into the film forming chamber 101.

On the other hand, the activation chamber (A) 112 was packed with solid carbon particles 114, heated thereby bringing carbon into a red hot state, whereinto $CF_4$ was blown through the inflow pipe 115 from the bomb (not shown), thus forming active species of $CF_2^*$, which were then introduced into the film forming chamber 101 via the inflow pipe 116.

Thus, while maintaining the inner pressure in the film forming chamber 101 at 0.3 Torr, the film forming chamber 101 was maintained internally at 200° C. by means of the heat energy generating device 117 to form an A-SiOC(H,X) film (film thickness: 700 Å). The film forming speed was 10 Å/sec.

Subsequently, the A-SiOC(H,X) film obtained was placed in a vacuum deposition tank, wherein a comb-type Al-gap electrode (gap length 250μ, width 5 mm) was formed under vacuum of $10^{-5}$ Torr, and the dark electroconductivity $\sigma_d$ was determined by measuring dark current at an applied voltage of 15V for evaluation of the film characteristics of the respective samples. The results are shown in Table 1E.

EXAMPLE 34

Except for introducing $H_3SiOSiH_3/H_2/F_2$ gases (gas ratio: $H_3SiOSiH_3/H_2/F_2 = 10:10:3$) from the bomb for gas feeding 106, A-SiOC(H,X) films were formed according to the same method and procedures as in Example 33. The dark electroconductivities were measured for respective samples to obtain the results shown in Table 1E.

From Table 1E, it can be seen that amorphous deposited films excellent in electrical characteristics can be obtained according to the present invention.

EXAMPLE 35

By means of the device as shown in FIG. 4, a drum-shaped image forming member for electrophotography with a layer construction as shown in FIG. 1 was prepared according to the operations as described below.

In FIG. 4, 201 shows a film forming chamber, 202 an activation chamber (A), 203 an electric furnace, 204 solid carbon particles, 205 an inflow pipe for the starting material of active species (A), 206 a pipe for introducing active species, 207 a motor, 208 a heater which is used similarly as 104 in FIG. 3, 209 and 210 are blowing pipes, 211 an aluminum cylinder substrate and 212 a gas discharging valve. 213 through 216 are starting gas feeding sources similarly as 106 through 109 in FIG. 3, and 217-1 is a gas introducing pipe.

In the film forming chamber 201, the aluminum cylinder 211 is suspended, equipped internally thereof with the heater 208 so as to be rotatable with the motor 207.

218 is a heat energy generating device and, for example, conventional electric furnaces, high frequency heating devices, various heat generating elements, etc. may be employed.

The activation chamber (A) 202 was packed with solid carbon particles 204, heated by the electric furnace 203 to be maintained at about 1000° C. to bring carbon into a red hot state, whereinto $CF_4$ was blown through the pipe 203 to form active species of $CF_2^*$, which were then introduced into the film forming chamber 201 via the inflow pipe 206.

Further, from the activation chamber (C) (not shown) having the same structure as the activation chamber (A), active species (C) of $SiF_2^*$ formed from solid Si particles and $SiF_4$ was introduced in the same manner.

On the other hand, through the inflow pipe 217-1, gasified disiloxane was introduced into the activation chamber (B) 219. The disiloxane gas introduced was subjected to activation treatment such as plasma formation by means of the microwave plasma generating device 220 in the activation chamber (B) 219 to become activated disiloxane, which was then introduced through the inflow pipe 217-2 into the film forming chamber 201. During this operation, if desired, impurity gases such as $PH_3$, $B_2H_6$, etc. were also activated by introduction into the activation chamber (B) 219.

While maintaining the pressure in the film forming chamber 201 at 0.8 Torr, the film forming chamber was maintained internally at 210° C. by means of the heat energy generating device 218.

The aluminum cylinder 211 was rotated, while the discharging gas was discharged by controlling adequately the opening of the discharging valve 212. Thus, an intermediate layer 12 was formed to a film thickness of 2000 Å.

Also, the photosensitive layer 13 was formed in the same manner as in the case of the intermediate layer 12 without use of $CF_4$ of the gases used for formation of the intermediate layer 12, using also $H_2$ gas in place of disiloxane, by introducing a gas mixture of $H_2/B_2H_6$ (0.2% of $B_2H_6$ in terms of vol. %) through the inflow pipe 217-1.

COMPARATIVE EXAMPLE 5

According to the plasma CVD method of the prior art, an image forming member for electrophotography having a layer construction as shown in FIG. 1 was formed by use of respective gases of $CF_4$, $SiF_4$, disiloxane, $H_2$ and $B_2H_6$ by means of the device having the same film forming chamber as the film forming chamber 201 provided with a high frequency means of 13.56 MHz.

The conditions for preparation of the drum-shaped image forming members for electrophotography obtained in Example 35 and Comparative example 5 and their performances are shown in Table 2E.

EXAMPLE 36

By means of the device as shown in FIG. 3, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, active species $SiF_2^*$ formed similarly as in Example 35 was introduced into the film forming chamber 101. Also, $H_2$ gas and $PH_3$ gas (diluted to 1000 ppm with hydrogen gas) were respectively introduced into the activation chamber (B) 123 to be activated. Then, the activated gases were introduced through the inflow pipe 116 into the film forming chamber 101. While maintaining the pressure in the film forming chamber at 0.1 Torr, and the substrate temperature at 200° C., an n-type A-Si(H,X) film 24 (film thickness: 700 Å) doped with P was formed.

Next, according to the same method as in formation of the n-type A-Si(H,X) film except for stopping introduction of $PH_3$ gas and using $SiF_2^*/CF_2^*$, a non-doped A-Si(H,X) fil 25 (film thickness: 5000 Å) was formed.

Subsequently, by using $B_2H_6$ gas (diluted to 1000 ppm with hydrogen gas) together with $H_3SiOSiH_3/H_2$ gas (mixing ratio 1:) in place of $H_2/PH_3$ gas, following otherwise the same conditions as in the case of n-type, a p-type A-SiO(H,X) film 26 (film thickness: 700 Å) doped with B was formed. Further, on this p-type film was formed by vapor deposition an aluminum electrode 27 with a thickness of 1000 Å to provide a PIN type diode.

The diode element thus obtained (area 1 cm$^2$) was subjected to measurement of I - V characteristic, and rectifying characteristic and photovoltaic effect were evaluated. The results are shown in Table 3E.

Also, in photoirradiation characteristics, light was introduced from the substrate side, and a conversion efficiency of 8.0% or higher, an open circuit voltage of 0.82V and a short circuit current of 10 mA/cm$^2$ were obtained at a photoirradiation intensity AMI (about 100 mW/cm$^2$).

EXAMPLE 37

Except for introducing $F_2$ gas from the inflow pipe 110 in addition to $H_3SiOSiH_3/H_2$ gas (gas ratio: $H_3SiOSiH_3/H_2/F_2 = 1:15:2$), the same PIN type diode as in Example 36 was prepared in the same manner as in Example 36. The rectifying characteristic and photovoltaic effect were evaluated and the results are shown in Table 3E.

From Table 3E, it can be seen that an amorphous semiconductor diode having better optical and electrical characteristics as compared with the prior art can be obtained according to the present invention.

EXAMPLE 38

By means of the device as shown in FIG. 3, amorphous deposited films were formed according to the operations as described below.

In FIG. 3, 101 is a film forming chamber, and a desired substrate 103 is placed on a substrate supporting stand 102 provided internally therein.

104 is a heater for heating the substrate, and electricity is supplied through a conductive wire 105 to generate heat. The substrate temperature is not particularly limited, but it should preferably be 30° to 450° C., more preferably 50° to 350° C., in practicing the process of the present invention.

106 through 109 are gas feeding systems, and they are provided corresponding to the nitrogen compound, and the kinds of gases optionally employed such as hydrogen, halogen compounds, inert gases, silicon compounds, carbon compounds, germanium compounds, oxygen compounds and compounds containing impurity elements as the component. When these gases employed are liquid under the standard condition, a suitable gasifying device is provided. In the drawing, symbols of the gas feeding sources 106 through 109 affixed with a are branched pipes, those affixed with b flowmeters, those affixed with c pressure gauges for measuring the pressures on the higher pressure side of the respective flowmeters, those affixed with d or e valves for controlling the flow rates of respective gases. 123 is the activation chamber (B) for forming active species (B) and, around the activation chamber 123, there is provided the microwave plasma generating device 12 for generating activation energy for formation of active species (B). The starting gas for formation of active species (B) supplied from the gas inflow pipe 110 is activated in the activation chamber (B), and the active species (B) formed is introduced through the inflow pipe 124 into the film forming chamber 101. 111 is a gas pressure gauge. In the drawing, 112 shows an activation chamber (A), 113 an electric furnace, 114 solid carbon particles and 115 a pipe for introduction of a gaseous compound containing carbon and halogen as the starting material for active species (A). The active species (A) formed in the activation chamber 112 is introduced through the inflow pipe 116 into the film forming chamber 101.

117 is a heat energy generating device and, for example, conventional electric furnaces, high frequency heating devices, various heat generating elements, etc. may be employed.

The heat from the heat energy generating device 117 is allowed to act on the active species flowing in the direction of the arrowhead 119, and the heated active species undergo mutually chemical reaction thereby to form a nitrogen-containing amorphous deposited film on the whole or the desired portion of the substrate 103. In the drawing, 120 shows a gas discharging valve and 121 a gas discharging pipe.

First, a polyethyleneterephthalate film 103 was placed on a supporting stand 102, and the film forming chamber 101 was evacuated by use of an evacuating device to about $10^{-6}$ Torr. Triethylsilazane made gaseous from the bomb for gas feeding 106 was introduced into the activation chamber (B) 123 through the gas inflow pipe 110 while maintaining the substrate at the temperature shown in Table 1F.

Triethylsilazane, etc. introduced into the activation chamber (B) 123 was activated by means of the microwave plasma generating device 122 to be converted to activated triethylsilazane, which was then introduced through the inflow pipe 124 into the film forming chamber 101.

On the other hand, the activation chamber (A) 112 was packed with solid carbon particles 114, heated by the electric furnace 113 to be maintained at about 1000° C., thereby bringing carbon into a red hot state, whereinto $CF_4$ was blown through the inflow pipe 115 from a bomb (not shown), thus forming active species of $CF_2^*$, which were then introduced into the film forming chamber 101 via the inflow pipe 124.

Thus, while maintaining the inner pressure in the film forming chamber 101 at 0.3 Torr, the film forming space 101 was maintained internally at 200° C. by means of the heat energy generating device to form an A-SiNC(H,X) film (film thickness: 700 Å). The film forming speed was 33 Å/sec.

Subsequently, the non-doped or p-type samples obtained were each placed in a vacuum deposition tank, wherein a comb-type Al-gap electrode (gap length 250μ, width 5 mm) was formed under vacuum of $10^{-5}$ Torr, and the dark electroconductivity $\sigma_d$ was determined by measuring dark current at an applied voltage of 10V for evaluation of the film characteristics of the respective samples. The results are shown in Table 1F.

EXAMPLE 39

Except for introducing $(C_2H_5)_3SiNH_2/H_2/F_2$ gases (gas ratio=8:8:1) from the gas feeding bomb 106, etc., A-SiNC(H,X) film was formed according to the same method and procedures as in Example 38. The dark electroconductivities were measured for respective samples to obtain the results shown in Table 1F.

From Table 1F, it can be seen that amorphous deposited films excellent in electrical characteristics can be obtained even at low substrate temperature according to the present invention.

EXAMPLE 40

By means of the device as shown in FIG. 4, a drum-shaped image forming member for electrophotography with a layer construction as shown in FIG. 1 was prepared according to the operations as described below.

In FIG. 4, 201 shows a film forming chamber, 202 an activation chamber (A), 203 an electric furnace, 204 solid carbon particles, 205 an inflow pipe for the starting material of active species (A), 206 a pipe for introducing active species, 207 a motor, 208 a heater which is used similarly as 104 in FIG. 3, 209 and 210 are blowing pipes, 211 an aluminum cylinder substrate and 212 a gas discharging valve. 213 through 216 are starting gas feeding sources similarly as 106 through 109 in FIG. 1, and 217-1 is a gas introducing pipe.

In the film forming chamber 201, the aluminum cylinder 211 is suspended, equipped internally thereof with the heater 208 so as to be rotatable with the motor 207. 218 is a heat energy generating device and, for example, conventional electric furnaces, high frequency heating devices, various heat generating elements, etc. may be employed.

The activation chamber (A) 202 was packed with solid carbon particles 204, heated by the electric furnace 203 to be maintained at about 1000° C. to bring carbon into a red hot state, whereinto $CF_4$ was blown into to form active species (A) of $CF_2^*$, which was then introduced into the film forming chamber 201 via the inflow pipe 206.

Further, from the activation chamber (C) (not shown) having the same structure as the activation chamber (A), active species (C) of $SiF_2^*$ formed from solid Si particles and $SiF_4$ was introduced in the same manner.

On the other hand, through the inflow pipe 217-1, gasified triethyldisilazane was introduced into the activation chamber (B) 219. The triethyldisilazane gas introduced was subjected to activation treatment such as plasma formation by means of the microwave plasma generating device 220 in the activation chamber (B) 219 to become activated triethyldisilazane, which was then introduced through the inflow pipe 217-2 into the film forming chamber 201. During this operation, if desired, impurity gases such as $PH_3$, $B_2H_6$, etc. were also introduced into the activation chamber (B) 219.

The aluminum cylinder 211 was heated by the heater 208 to 220° C., maintained thereat and rotated, while the discharging gas was discharged by controlling adequately the opening of the discharging valve 212. Thus, an intermediate layer 12 was formed to a film thickness of 2000 Å.

Also, the photosensitive layer 13 was formed similarly as in the case of the intermediate layer 12 without use of $CF_4$ of the gases used for formation of the intermediate layer 12, using also $H_2$ gas in place of triethyldisilazane, by introducing a gas mixture of $H_2/B_2H_6$ (0.2% of $B_2H_6$ in terms of vol. %) through the inflow pipe 217-1.

COMPARATIVE EXAMPLE 6

According to the plasma CVD method of the prior art, an image forming member for electrophotography having a layer construction as shown in FIG. 1 was formed by use of respective gases of $CF_4$, $SiF_4$, triethyldisilazane, $H_2$ and $B_2H_6$ by means of the device having the same film forming chamber as the film forming chamber 201 provided with a high frequency means of 13.56 MHz.

The conditions for preparation of the drum-shaped image forming members for electrophotography obtained in Example 40 and Comparative example 6 and their performances are shown in Table 2F.

EXAMPLE 41

By means of the device as shown in FIG. 3, a PIN type diode as shown in FIG. 2 was prepared.

First, a polyethyleneterephthalate film 21 having ITO film 22 with a thickness of 1000 Å vapor deposited thereon was placed on a supporting stand and, after reduced to a pressure of $10^{-6}$ Torr, active species $SiF_2^*$ formed similarly as in Example 40 was introduced into the film forming chamber 101. Also, $H_2$ gas and $PH_3$ gas (diluted to 1000 ppm with hydrogen gas) were respectively introduced into the activation chamber (B) 123 to be activated. Then, the activated gases were introduced through the inflow pipe 116 into the film forming chamber 101. While maintaining the pressure in the film forming chamber 101 at 0.1 Torr and maintaining the substrate temperature at 220° C., an n-type A-Si(H,X) film 24 (film thickness 700 Å) doped with P was formed.

Next, according to the same method as in formation of the n-type A-Si(H,X) film except for stopping introduction of $PH_3$ gas and using $SiF_2^*/CF_2^*$, a non-doped A-Si(H,X) film 25 (film thickness: 5000 Å) was formed.

Subsequently, by using $B_2H_6$ gas (diluted to 1000 ppm with hydrogen gas) together with $(C_2H_5)_3SiNH_2/H_2$ gas (mixing ratio 1:10) in place of $H_2/PH_3$ gas, following otherwise the same conditions as in the case of n-type, a p-type A-SiNC(H,X) film 26 (film thickness: 700 Å) doped with B was formed. Further, on this p-type film was formed by vapor deposition an aluminum electrode 27 with a thickness of 1000 Å to provide a PIN type diode.

The diode element thus obtained (area 1 cm²) was subjected to measurement of I - V characteristic, and rectifying characteristic and photovoltaic effect were evaluated. The results are shown in Table 3F.

Also, in photoirradiation characteristics, light was introduced from the substrate side, and a conversion efficiency of 9.0% or higher, an open circuit voltage of 0.92V and a short circuit current of 10 mA/cm² were obtained at a photoirradiation intensity AMI (about 100 mW/cm²).

EXAMPLE 42

Except for introducing, from the gas inflow pipe 110 in addition to $(C_2H_5)_3SiNH_2/H_2$ gas, $F_2$ gas, $[(C_2H_5)_3ScNH_2/H_2/F_2=1:15:2]$, the same diode as in Example 41 was prepared in the same manner as in Example 41. The rectifying characteristic and photovoltaic effect were evaluated and the results are shown in Table 3F.

From Table 3F, it can be seen that an amorphous semiconductor diode having better optical and electrical characteristics as compared with the prior art can be obtained according to the present invention.

TABLE 1A

|  | Example 1 | Example 2 |
|---|---|---|
| Starting gas for formation of active species (B) | $H_2$ | $H_2/F_2$ |
| $\sigma_d$ (Non-doped) $(\Omega \cdot cm)^{-1}$ | $7.1 \times 10^{-13}$ | $8.8 \times 10^{-13}$ |

TABLE 2A

|  | Example 3 | Comparative example 1 |
|---|---|---|
| Starting gas for formation of active species (A) | $CF_4/SiF_4$ |  |
| Activation temperature | 1100° C. |  |
| Main decomposed active species | $CF_2^*$ $SiF_2^*$ |  |
| Starting gas for formation of active species (B) | $H_2$ |  |
| Inflow amount from activation chamber (A) | 200 SCCM |  |
| Inflow amount from activation chamber (B) | 100 SCCM |  |
| Inflow amount from starting gas bomb |  | $CF_4$ 50 SCCM $SiF_4$ 100 SCCM |

TABLE 2A-continued

|  | Example 3 | Comparative example 1 |
|---|---|---|
|  |  | H$_2$ 100 SCCM |
| Inner pressure in film forming chamber | 0.8 Torr | 0.9 Torr |
| Temperature in film forming chamber | 205° C. |  |
| Film forming rate | 18 Å/sec | 2 Å/sec |
| RF discharging power |  | 1.8 W/cm$^2$ |
| Layer thickness of photosensitive layer 13 | 23μ | 23μ |
| Average number of image defects in 10 drum-shaped image forming members for electrophotography | 2 | 16 |
| Acceptance potential irregularity in circumferential direction | ±5 V | ±30 V |
| Acceptance potential irregularity in axial direction | ±10 V | ±35 V |
| Remarks | Example according to the process of this invention | Example according to plasma CVD of the prior art Substrate temperature ... 250° C. |

TABLE 3A

|  | Example 4 | Example 5 |
|---|---|---|
| Gas for formation starting gas | H$_2$ | H$_2$/F$_2$ |
| Rectifying ratio of diode*[1] | 6 × 10$^2$ | 5 × 10$^2$ |

TABLE 3A-continued

|  | Example 4 | Example 5 |
|---|---|---|
| n value of diode*[2] | 1.4 | 1.5 |

*[1] Ratio of forward current to reverse current at voltage 1V
*[2] n value (Quality Factor) in the current formula of p-n junction:

$$J = Js\left\{ \exp\left(\frac{eV}{nRT}\right) - 1 \right\}$$

TABLE 1B

|  | Example 6 | Example 7 | Example 8 | Example 9 |
|---|---|---|---|---|
| Starting gas for formation of active species (B) | Si$_5$H$_{10}$ | Si$_4$H$_{10}$ | SiH$_3$SiH | H$_6$Si$_6$F$_6$ |
| Substrate temperature (°C.) | 200 | 200 | 200 | 200 |
| σd (Non-doped) (Ω · cm)$^{-1}$ | 4.1 × 10$^{-13}$ | 3.5 × 10$^{-13}$ | 2.8 × 10$^{-13}$ | 3 × 10$^{-13}$ |
| σd (B-doped) (Ω · cm)$^{-1}$ | 5.1 × 10$^{-12}$ | 4.0 × 10$^{-12}$ | 3.8 × 10$^{-12}$ | 2.8 × 10$^{-12}$ |
| σd (P-doped) (Ω · cm)$^{-1}$ | 4.8 × 10$^{-11}$ | 3.8 × 10$^{-11}$ | 3.5 × 10$^{-11}$ | 3.1 × 10$^{-11}$ |

TABLE 2B

|  | Example 10 | Comparative example 2 |
|---|---|---|
| Starting gas for formation of active species (A) | CF$_4$ |  |
| Activation temperature | 1100° C. |  |
| Main active species | CF$_2$* |  |
| Starting gas for formation of active species (B) | Si$_2$H$_6$/H$_2$ |  |
| Inflow amount from activation chamber (A) | 190 SCCM |  |
| Inflow amount from activation chamber (B) | 100 SCCM |  |
| Inflow amount from starting gas bomb |  | CF$_4$ 200 SCCM Si$_2$H$_6$ 100 SCCM H$_2$ 100 SCCM |
| Inner pressure in film forming chamber | 1.0 Torr | 1.0 Torr |
| Substrate temperature | 210° C. |  |
| Temperature in film forming chamber | 200° C. |  |
| Film forming rate | 28 Å/sec | 5 Å/sec |
| RF discharging power |  | 1.8 W/cm$^2$ |
| Layer thickness of photosensitive layer 13 | 22μ | 22μ |
| Average number of image defects in 10 drum-shaped image forming members for electrophotography | 3 | 17 |
| Acceptance potential irregularity in circumferential direction | ±9 V | ±30 V |
| Acceptance potential irregularity in axial direction | ±15 V | ±34 V |
| Remarks | Example according to the process of this invention | Example according to plasma CVD of the prior art Substrate temperature ... |

TABLE 2B-continued

|  | Example 10 | Comparative example 2 |
|---|---|---|
|  |  | 250° C. |

TABLE 3B

|  | Example 11 | Example 12 | Example 13 | Example 14 |
|---|---|---|---|---|
| Starting gas for formation of active species (B) | $Si_3H_6$ | $Si_4H_{10}$ | $SiH_3SiH(SiH_3)SiH_3$ | $H_6Si_6F_6$ |
| Substrate temperature (°C.) | 210 | 210 | 220 | 220 |
| Rectifying ratio of diode*[1] | $7.9 \times 10^2$ | $7.9 \times 10^2$ | $6.9 \times 10^2$ | $8.4 \times 10^2$ |
| n value of diode*[2] | 1.2 | 1.2 | 1.4 | 1.25 |

*[1] Ratio of forward current to reverse current at voltage 1V
*[2] n value (Quality Factor) in the current formula of p-n junction:

$$J = Js \left\{ \exp\left(\frac{eV}{nRT}\right) - 1 \right\}$$

TABLE 1C

|  | Example 15 | Example 16 | Example 17 | Example 18 |
|---|---|---|---|---|
| Starting gas for formation of active species (B) | $CH_4$ | $C_2H_6$ | $C_2H_4$ | $C_2H_2$ |
| Substrate temperature (°C.) | 210 | 210 | 220 | 220 |
| $\sigma_d$ $(\Omega \cdot cm)^{-1}$ | $8.0 \times 10^{-9}$ | $3.8 \times 10^{-9}$ | $4.8 \times 10^{-9}$ | $4.5 \times 10^{-9}$ |

TABLE 2C

|  | Example 19 | Comparative example 3 |
|---|---|---|
| Starting gas for formation of active species (A) | $CF_4$ |  |
| Activation temperature | 1100° C. |  |
| Main activated active species | $CF_2^*$ |  |
| Starting gas for formation of active species (B) | $CH_4/Si_2H_6/H_2$ (Volume ratio 0.1:2:1) |  |
| Inflow amount from activation chamber (A) | 200 SCCM |  |
| Inflow amount from activation chamber (B) | 100 SCCM |  |
| Inflow amount from starting gas bomb |  | $CF_4$ 200 SCCM $CH_4$ 50 SCCM $Si_2H_6$ 100 SCCM $H_2$ 100 SCCM |
| Inner pressure in deposition space | 1.0 Torr | 1.0 Torr |
| Substrate temperature | 220° C. |  |
| Temperature in film forming chamber | 200° C. |  |
| RF discharging power |  | 1.7 W/cm² |
| Layer thickness of photosensitive layer 13 | 22μ | 22μ |
| Average number of image defects in 10 drum-shaped image forming members for electrophotography | 3 | 15 |
| Acceptance potential irregularity in circumferential direction | ±8 V | ±28 V |
| Acceptance potential irregularity in axial direction | ±15 V | ±35 V |
| Remarks | Example according to the process of this invention | Example according to plasma CVD of the prior art Substrate temperature ... 250° C. |

TABLE 3C

|  | Example 20 | Example 21 | Example 22 | Example 23 |
|---|---|---|---|---|
| Starting gas for formation of active species (B) | $CH_4$ | $C_2H_6$ | $C_2H_4$ | $C_2H_2$ |
| Substrate temperature (°C.) | 210 | 210 | 200 | 200 |
| Rectifying ratio of diode*[1] | $7 \times 10^2$ | $7 \times 10^2$ | $6.5 \times 10^2$ | $7.5 \times 10^2$ |

TABLE 3C-continued

|  | Example 20 | Example 21 | Example 22 | Example 23 |
|---|---|---|---|---|
| n value of diode*[2] | 1.1 | 1.1 | 1.1 | 1:25 |

*[1] Ratio of forward current to reverse current at voltage 1V
*[2] n value (Quality Factor) in the current formula of p-n junction:

$$J = J_s \left\{ \exp\left(\frac{eV}{nRT}\right) - 1 \right\}$$

TABLE 1D

|  | Example 24 | Example 25 | Example 26 | Example 27 |
|---|---|---|---|---|
| Starting gas for formation of active species (B) | $GeH_4$ | Straight chain $Ge_4H_{10}$ | Branched $Ge_4H_{10}$ | $H_6Ge_6F_6$ |
| Substrate temperature (°C.) | 220 | 220 | 210 | 210 |
| $\sigma d$ (Non-doped) $(\Omega \cdot cm)^{-1}$ | $9.0 \times 10^{-9}$ | $7.5 \times 10^{-9}$ | $8.0 \times 10^{-9}$ | $6.0 \times 10^{-9}$ |
| $\sigma d$ (B-doped) $(\Omega \cdot cm)^{-1}$ | $7.3 \times 10^{-8}$ | $3.1 \times 10^{-8}$ | $3.3 \times 10^{-8}$ | $6.4 \times 10^{-8}$ |
| $\sigma d$ (P-doped) $(\Omega \cdot cm)^{-1}$ | $5.6 \times 10^{-7}$ | $2.0 \times 10^{-7}$ | $2.8 \times 10^{-7}$ | $4.7 \times 10^{-7}$ |

TABLE 2D

|  | Example 28 | Comparative example 4 |
|---|---|---|
| Starting gas for formation of active species (A) | $CF_4$ |  |
| Activation temperature | 1100° C. |  |
| Main formed active species | $CF_2*$ |  |
| Starting gas for formation of active species (B) | $Si_2H_6$/$GeH_4$/$H_2$ |  |
| Inflow amount from activation chamber (A) | 200 SCCM |  |
| Inflow amount from activation chamber (B) | 100 SCCM |  |
| Inflow amount from starting gas bomb |  | $CF_4$ 200 SCCM $Si_2H_6$ 100 SCCM $GeH_4$ 50 SCCM $H_2$ 100 SCCM |
| Inner pressure in film forming chamber | 1.0 Torr | 1.0 Torr |
| Substrate temperature | 220° C. | 280° C. |
| Temperature in film forming chamber | 200° C. |  |
| Film forming rate | 15 Å/sec | 5 Å/sec |
| RF discharging power |  | 130 W |
| Layer thickness of photosensitive layer 13 | 22μ | 22μ |
| Average number of image defects in 10 drum-shaped image forming members for electrophotography | 4 | 20 |
| Acceptance potential irregularity in circumferential direction | ±13 V | ±35 V |
| Acceptance potential irregularity in axial direction | ±17 V | ±40 V |
| Remarks | Example according to the process of this invention | Example according to plasma CVD of the prior art |

TABLE 3D

|  | Example 29 | Example 30 | Example 31 | Example 32 |
|---|---|---|---|---|
| Starting gas for formation of active species (B) | $GeH_4$ | Straight chain $Ge_4H_{10}$ | branched $Ge_4H_{10}$ | $H_6Ge_6F_6$ |
| Substrate temperature (°C.) | 200 | 200 | 210 | 210 |
| Rectifying ratio of diode*[1] | $7.5 \times 10^2$ | $7.5 \times 10^2$ | $7.2 \times 10^2$ | $7.9 \times 10^2$ |
| n value of diode*[2] | 1.4 | 1.4 | 1.42 | 1.38 |

*[1] Ratio of forward current to reverse current at voltage 1V
*[2] n value (Quality Factor) in the current formula of p-n junction:

$$J = J_s \left\{ \exp\left(\frac{eV}{nRT}\right) - 1 \right\}$$

TABLE 1E

|  | Example 33 | Example 34 |
|---|---|---|
| Starting gas for formation of active species (B) | $H_3SiOSiH_3$ | $H_3SiOSiH_3$/$H_2$/$F_2$ |

TABLE 1E-continued

|  | Example 33 | Example 34 |
|---|---|---|
| Substrate temperature (°C.) | 200 | 200 |
| $\sigma d$ | $7.2 \times 10^{-10}$ | $8.2 \times 10^{-10}$ |

TABLE 1E-continued

|  | Example 33 | Example 34 |
|---|---|---|
| $(\Omega \cdot cm)^{-1}$ |  |  |

TABLE 2E

|  | Example 35 | Comparative example 5 |
|---|---|---|
| Starting gas for formation of active species (A) | $CF_4/SiF_4$ |  |
| Activation temperature | 1000° C. |  |
| Main formed active species | $CF_2^*$, $SiF_2^*$ |  |
| Starting gas for formation of active species (B) | Disiloxane, $H_2$ |  |
| Inflow amount from activation chamber (A) | 200 SCCM |  |
| Inflow amount from activation chamber (B) | 100 SCCM |  |
| Inflow amount from starting gas bomb |  | $CF_4$ 50 SCCM<br>$SiF_4$ 100 SCCM<br>Disiloxane 50 SCCM<br>$H_2$ 100 SCCM |
| Inner pressure in film forming chamber | 0.3 Torr | 1.0 Torr |
| Substrate temperature | 210° C. | 260° C. |
| Temperature in film forming chamber | 200° C. |  |
| Film forming rate | 10 Å/sec | 5 Å/sec |
| RF discharging power |  | 1.8 W/cm$^2$ |
| Layer thickness of photosensitive layer 13 | 22μ | 22μ |
| Average number of image defects in 10 drum-shaped image forming members for electrophotography | 5 | 20 |
| Acceptance potential irregularity in circumferential direction | ±12 V | ±28 V |
| Acceptance potential irregularity in axial direction | ±15 V | ±33 V |
| Remarks | Example according to the process of this invention | Example according to plasma CVD of the prior art |

TABLE 3E

|  | Example 36 | Example 37 |
|---|---|---|
| Starting gas for formation of active species (B) | $H_3SiOSiH_3/H_2$ | $H_3SiOSiH_3/H_2/F_2$ |
| Substrate temperature (°C.) | 200 | 200 |
| Rectifying ratio of diode*[1] | $2 \times 10^2$ | $2.5 \times 10^2$ |
| n value of diode*[2] | 1.1 | 1.2 |

*[1] Ratio of forward current to reverse current at voltage 1V
*[2] n value (Quality Factor) in the current formula of p-n junction:

$$J = J_s \left\{ \exp\left(\frac{eV}{nRT}\right) - 1 \right\}$$

TABLE 1F

|  | Example 38 | Example 39 |
|---|---|---|
| Starting gas for formation of active species (B) | $(C_2H_5)_3SiNH_2$ | $(C_2H_5)_3SiNH_2/H_2/F_2$ |
| Substrate temperature (°C.) | 220 | 230 |
| $\sigma_d$ (Non-doped) $(\Omega \cdot cm)^{-1}$ | $1.4 \times 10^{-9}$ | $1.0 \times 10^{-9}$ |

TABLE 2F

|  | Example 40 | Comparative example 6 |
|---|---|---|
| Starting gas for formation of active species (A) | $CF_4/SiF_4$ |  |
| Activation temperature | 1100° C. |  |
| Main decomposed active species | $CF_2^*$, $SiF_2^*$ |  |
| Starting gas for formation of active species (B) | Triethyldisilazane $H_2$ |  |
| Inflow amount from activation chamber (A) | 200 SCCM |  |
| Inflow amount from activation chamber (B) | 100 SCCM |  |
| Inflow amount from starting gas bomb |  | $CF_4$ 50 SCCM<br>$SiF_4$ 100 SCCM<br>Triethyldisilazane 50 SCCM<br>$H_2$ SCCM |
| Inner pressure in film forming chamber | 0.5 Torr | 1.0 Torr |
| Substrate temperature | 220° C. | 260° C. |
| Temperature in film forming chamber | 200° C. |  |
| Film forming rate | 36 Å/sec | 7 Å/sec |
| EF discharging power |  | 1.8 W/cm$^2$ |
| Layer thickness of photosensitive layer 13 | 22μ | 22μ |
| Average number of image defects in 10 drum-shaped image forming members for electrophotography | 6 | 18 |
| Acceptance potential irregularity in circumferential direction | ±10 V | ±30 V |

TABLE 2F-continued

|  | Example 40 | Comparative example 6 |
|---|---|---|
| Acceptance potential irregularity in axial direction | ±15 V | ±35 V |
| Remarks | Example according to the process of this invention | Example according to plasma CVD of the prior art |

TABLE 3F

|  | Example 41 | Example 42 |
|---|---|---|
| Starting gas for formation of active species (B) | $(C_2H_5)_3SiNH_2/H_2$ | $(C_2H_5)_3SiNH_2/H_2/F_2$ |
| Substrate temperature (°C.) | 220 | 230 |
| Rectifying ratio of diode*[1] | $2.9 \times 10^2$ | $3.0 \times 10^2$ |
| n value of diode*[2] | 1.1 | 1.2 |

*[1] Ratio of forward current to reverse current at voltage 1V
*[2] n value (Quality Factor) in the current formula of p-n junction:

$$J = J_s \left\{ \exp\left(\frac{eV}{nRT}\right) - 1 \right\}$$

What is claimed is:

1. A process for forming a deposited film comprising separately introducing an active species (A) and an active species (B) into a film forming space housing a substrate therein, said active species (A) being formed by decomposing a compound containing carbon and a halogen; and said active species (B) being formed from a chemical substance for film formation which is chemically mutually reactive with said active species (A); and applying heat energy to said active species (A) and active species (B) and allowing both active species (A) and active species (B) to react chemically with each other to form a deposited film on the substrate.

2. A process according to claim 1, wherein said active species (B) is formed from hydrogen, a halogen compound or mixtures thereof.

3. A process according to claim 1, wherein said active species (B) is formed form a silicon containing compound.

4. A process according to claim 1, wherein said active species (B) is formed from a carbon containing compound.

5. A process according to claim 1, wherein said active species (B) is formed from a germanium containing compound.

6. A process according to claim 1, wherein said active species (B) is formed from an oxygen containing compound.

7. A process according to claim 1, wherein said active species (B) is formed from a nitrogen containing compound.

8. A process according to claim 1, wherein said active species (A) is formed by decomposing a partially or wholly halogen substituted chain or cyclic hydrocarbon.

9. A process according to claim 8, wherein said active species (B) is formed from hydrogen, a halogen compound or mixtures thereof.

10. A process according to claim 8, wherein said active species (B) is formed from a silicon containing compound.

11. A process according to claim 8, wherein said active species (B) is formed from a carbon containing compound.

12. A process according to claim 8, wherein said active species (B) is formed from a germanium containing compound.

13. A process according to claim 8, wherein said active species (B) is formed form an oxygen containing compound.

14. A process according to claim 8, wherein said active species (B) is formed from a nitrogen containing compound.

15. A process according to claim 1 further comprising introducing an active species (SX) into said film forming space; said active species (SX) being formed by decomposing a compound containing silicon and a halogen.

16. A process according to claim 15, wherein said active species (B) is formed from hydrogen, a halogen compound or mixtures thereof.

17. A process according to claim 15, wherein said active species (B) is formed from a silicon containing compound.

18. A process according to claim 15, wherein said active species (B) is formed from a carbon containing compound.

19. A process according to claim 15, wherein said active species (B) is formed from a germanium containing compound.

20. A process according to claim 15, wherein said active species (B) is formed from an oxygen containing compound.

21. A process according to claim 15, wherein said active species (B) is formed from a nitrogen containing compound.

22. A process according to claim 1, wherein the proportion in amount of said active species (A) to said active species (B) introduced into the film forming space is 10:1 to 1:10.

23. A process according to claim 1, wherein the life of said active species (A) is 0.1 second or longer.

* * * * *